United States Patent
Yu et al.

(10) Patent No.: US 10,879,220 B2
(45) Date of Patent: Dec. 29, 2020

(54) PACKAGE-ON-PACKAGE STRUCTURE AND MANUFACTURING METHOD THEREOF

(71) Applicant: Taiwan Semiconductor Manufacturing Co., Ltd., Hsinchu (TW)

(72) Inventors: Chen-Hua Yu, Hsinchu (TW); Kuo-Chung Yee, Taoyuan (TW); Chun-Hui Yu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/009,209

(22) Filed: Jun. 15, 2018

(65) Prior Publication Data

US 2019/0385989 A1 Dec. 19, 2019

(51) Int. Cl.
  *H01L 25/10* (2006.01)
  *H01L 23/538* (2006.01)
  (Continued)

(52) U.S. Cl.
  CPC ........ *H01L 25/105* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3121* (2013.01); *H01L 23/5383* (2013.01); *H01L 23/5386* (2013.01); *H01L 23/5389* (2013.01);
  (Continued)

(58) Field of Classification Search
  CPC ... H01L 25/105; H01L 25/50; H01L 21/4853; H01L 21/4857; H01L 21/565; H01L 21/568; H01L 21/6853; H01L 23/3121; H01L 23/5383; H01L 21/5386; H01L 21/5389; H01L 21/552; H01L 24/19; H01L 24/20
  See application file for complete search history.

(56) References Cited

U.S. PATENT DOCUMENTS

| | | | |
|---|---|---|---|
| 6,876,554 B1 * | 4/2005 | Inagaki | H01G 4/224 361/763 |
| 7,084,513 B2 * | 8/2006 | Matsuki | H01L 23/3114 257/685 |

(Continued)

*Primary Examiner* — Dale E Page
*Assistant Examiner* — Quovaunda Jefferson
(74) *Attorney, Agent, or Firm* — JCIPRNET

(57) ABSTRACT

A package-on-package structure including a first and second package is provided. The first package includes a first semiconductor die, a plurality of conductive pins, an insulating encapsulant, a backside connection structure and a redistribution layer. The conductive pins are surrounding the first semiconductor die and have a base portion with a first width and a body portion with a second width, the base portion is connected to the body portion and the first width being larger than the second width. The insulating encapsulant is encapsulating the first semiconductor die and the conductive pins. The backside connection structure is disposed on the first semiconductor die and electrically connected to the conductive pins. The redistribution layer is disposed on the first semiconductor die, and electrically connected to the first semiconductor die and the conductive pins. The second package is stacked on the first package and electrically connected to the backside connection structure.

20 Claims, 24 Drawing Sheets

(51) Int. Cl.
*H01L 23/552* (2006.01)
*H01L 23/00* (2006.01)
*H01L 25/00* (2006.01)
*H01L 21/683* (2006.01)
*H01L 21/48* (2006.01)
*H01L 21/56* (2006.01)
*H01L 23/31* (2006.01)

(52) U.S. Cl.
CPC ............ *H01L 23/552* (2013.01); *H01L 24/19* (2013.01); *H01L 24/20* (2013.01); *H01L 25/50* (2013.01); *H01L 2221/68372* (2013.01); *H01L 2224/214* (2013.01); *H01L 2225/1035* (2013.01); *H01L 2225/1041* (2013.01); *H01L 2225/1058* (2013.01); *H01L 2924/3025* (2013.01)

(56) References Cited

U.S. PATENT DOCUMENTS

| | | | |
|---|---|---|---|
| 8,320,134 B2 * | 11/2012 | Su | H01L 23/49827 174/262 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,224,697 B1 * | 12/2015 | Kwon | H01L 25/0652 |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2005/0184377 A1 * | 8/2005 | Takeuchi | H01L 21/6835 257/686 |
| 2008/0237834 A1 * | 10/2008 | Hu | H01L 21/6835 257/693 |
| 2008/0258293 A1 * | 10/2008 | Yang | H01L 23/3677 257/701 |
| 2011/0140259 A1 * | 6/2011 | Cho | H01L 25/16 257/686 |
| 2013/0105966 A1 * | 5/2013 | Kelkar | H01L 24/24 257/737 |
| 2015/0270232 A1 * | 9/2015 | Chen | H01L 24/02 257/691 |

\* cited by examiner

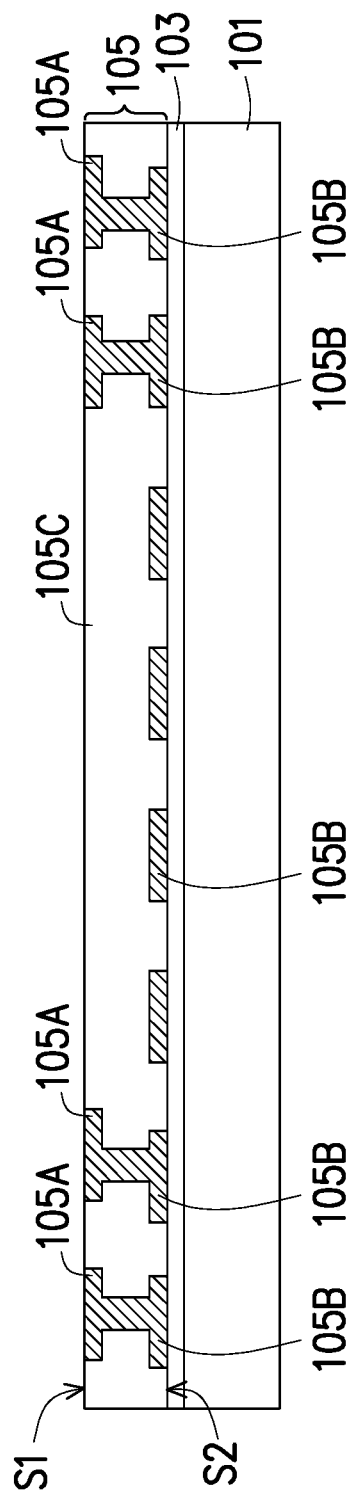
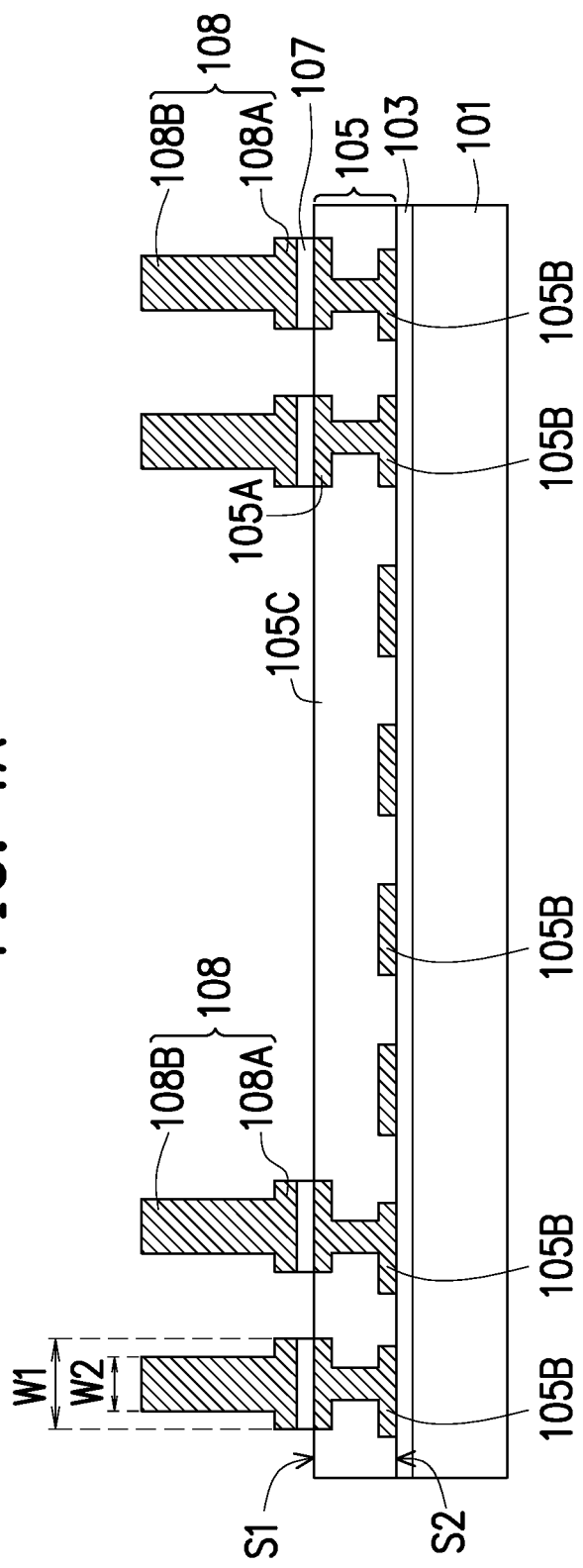

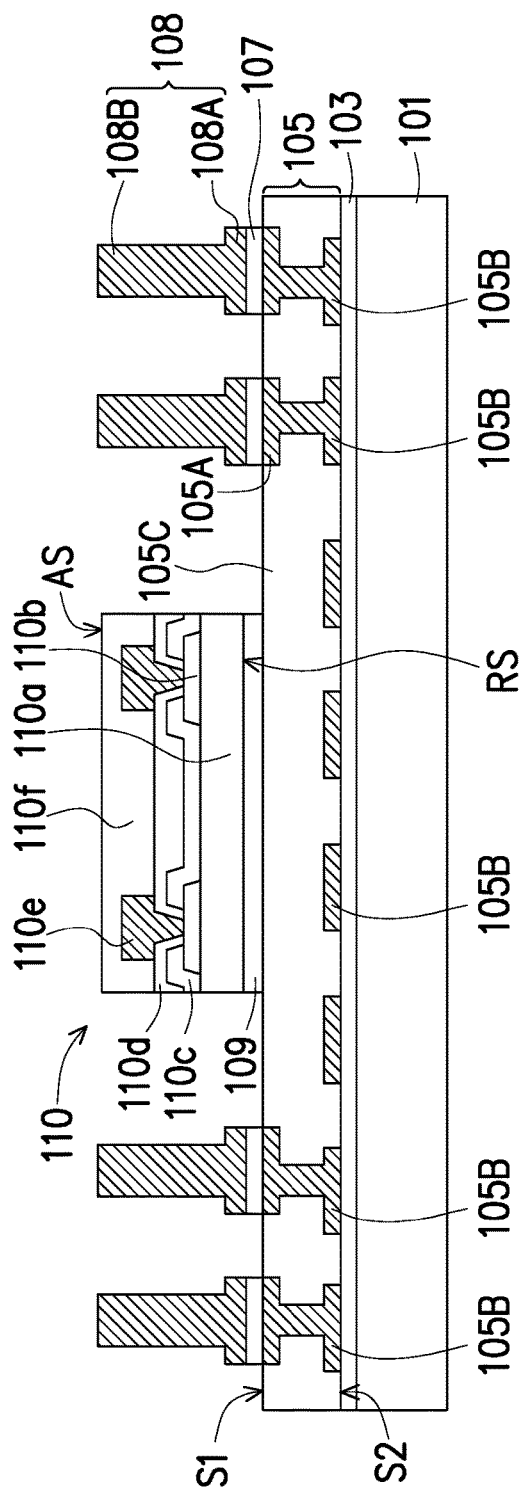
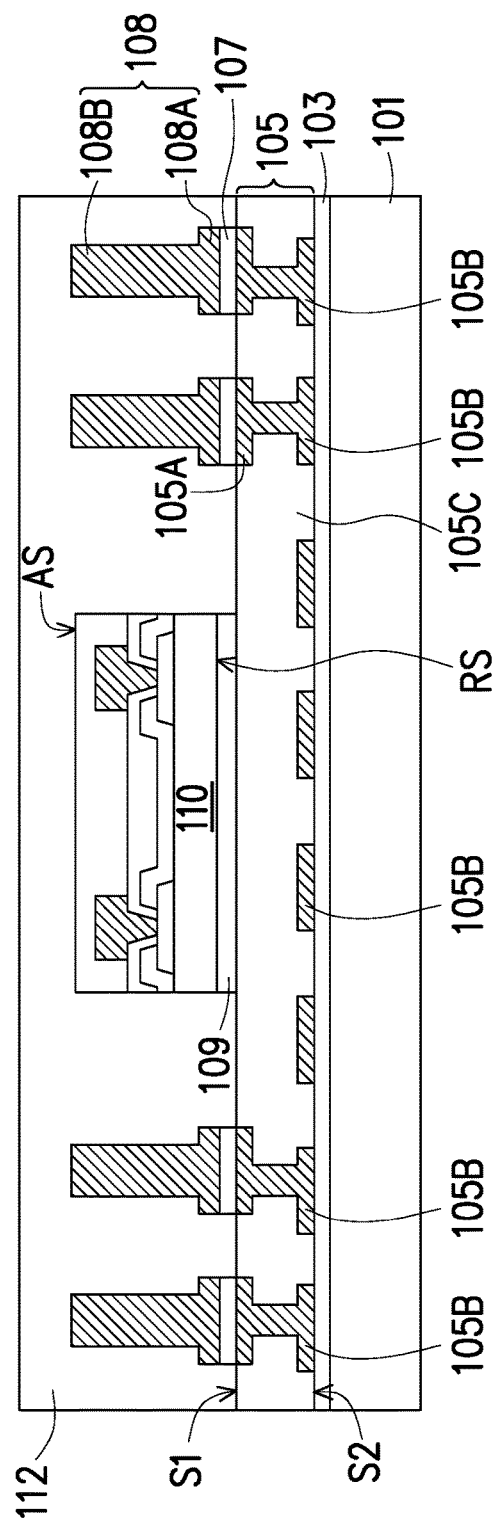

PACKAGE-ON-PACKAGE STRUCTURE AND MANUFACTURING METHOD THEREOF

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Currently, three-dimensional stacking technologies such as package-on-package (PoP) have been developed to meet the requirements of higher packaging densities.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1H are schematic cross-sectional views of various stages in a manufacturing method of a package-on-package (PoP) structure according to some exemplary embodiments of the present disclosure.

DETAILED DESCRIPTION

Figure 1E:
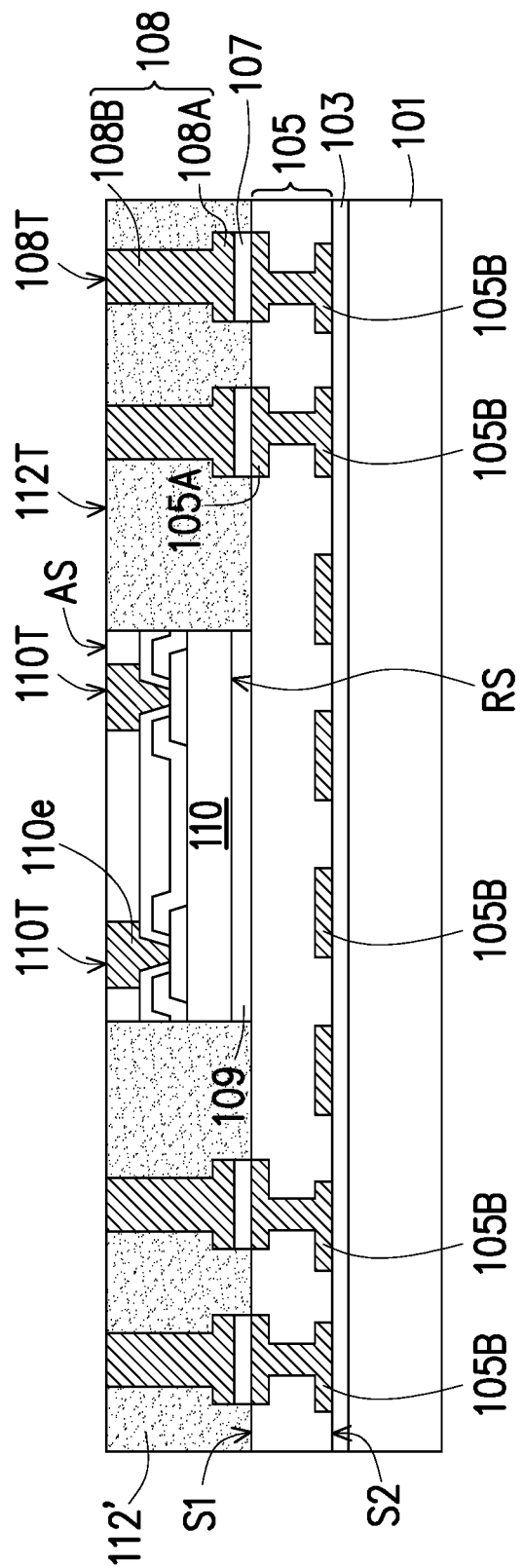

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H are schematic cross-sectional views of various stages in a manufacturing method of a package-on-package (PoP) structure according to some exemplary embodiments of the present disclosure. Referring to FIG. 1A, a carrier 101 with a de-bonding layer 103 coated thereon is provided. In some embodiments, the de-bonding layer 103 is formed on the upper surface of the carrier 101. The carrier 101 may be a glass carrier or any suitable carrier for carrying a semiconductor wafer or a reconstituted wafer used in the method of manufacturing the package-on-package structure. The de-bonding layer 103 may be a light-to-heat conversion (LTHC) release layer formed on the glass substrate. However, the disclosure is not limited thereto, and other suitable materials may be adapted for the carrier 101 and the de-bonding layer 103.

In some embodiments, a backside connection structure 105 is bonded onto the carrier 101, wherein the de-bonding layer 103 is located in between the backside connection structure 105 and the carrier 101. As illustrated in FIG. 1A, the backside connection structure 105 has a first connection layer 105A, a second connection layer 105B and a substrate 105C. The first connection layer 105A is exposed on a first surface S1 of the backside connection structure 105, while the second connection layer 105B is exposed on a second surface S2 of the backside connection structure 105. The first connection layer 105A may be connected to some of the second connection layer 105B. In some embodiments, the first surface S1 is facing away from the carrier 101, and the second surface S2 is opposite to the first surface S1 and facing towards the carrier 101. In other words, the second surface S2 of the backside connection structure 105 may be in contact with the bonding layer 103 on the carrier 101. Furthermore, in some embodiments, the first connection layer 105A and the second connection layer 105B are formed within the substrate 105C. In the exemplary embodiment, the substrate 105C is formed of dielectric materials such as epoxy, resin, glass fiber, prepreg (which comprises epoxy, resin, and/or glass fiber), polymers, or the like. In certain embodiments, the first connection layer 105A and the second connection layer 105B are formed of metallic materials.

Referring to FIG. 1B, a plurality of conductive pins 108 is disposed on the first surface S1 of the backside connection structure 105. The plurality of conductive pins 108 is pre-formed and disposed on the backside connection structure 105. In some embodiments, the conductive pins 108 are electrically connected to the first connection layer 105A of the backside connection structure 105 through a plurality of joint structures 107. For example, the joint structures 107 are electrically connected to the first connection layer 105A, while the conductive pins 108 are disposed on the joint structures 107 and electrically connected to the joint structures 107. In some embodiments, the joint structures 107 may be solder joints. In certain embodiments, the conductive pins 108 are through insulator via pins (TIV pins). For example, the conductive pins 108 may have a base portion 108A with a first width W1 and a body portion 108B with a second width W2. The base portion 108A is connected to the body portion 108B, and the first width W1 being larger than the second width W2. In some embodiments, the material of the conductive pins 108 may include copper or copper alloys.

Referring to FIG. 1C, a first semiconductor die 110 may be picked and placed on the first surface S1 of the backside connection structure 105. The first semiconductor die 110 is surrounded by the plurality of conductive pins 108. In the exemplary embodiment, the first semiconductor die 110 is disposed on the backside connection structure 105 after disposing the plurality of conductive pins 108. However, the disclosure is not limited thereto. In some alternative embodiments, the first semiconductor die 110 is disposed on the backside connection structure 105 before disposing the plurality of conductive pins 108. In the illustrated embodiment, the first semiconductor die 110 is attached to the backside connection structure 105 through an adhesive layer 109. The adhesive layer 109 may be a die attach film or formed from adhesive materials including epoxy resins, inorganic materials, organic polymeric materials, or the like, but the disclosure is not limited thereto. Furthermore, the first semiconductor die 110 may have an active surface AS and a rear surface RS opposite to the active surface AS. The rear surface RS of the first semiconductor die 110 is in contact with the adhesive layer 109, whereas the active surface AS is facing away from the backside connection structure 105.

As illustrated in FIG. 1C, the first semiconductor die 110, for example, includes a semiconductor substrate 110a, a plurality of conductive pads 110b, a passivation layer 110c, a post passivation layer 110d, a plurality of conductive posts or conductive pillars 110e, and a protection layer 110f. As illustrated in FIG. 1C, the plurality of conductive pads 110b is disposed on the semiconductor substrate 110a. The passivation layer 110c is formed over the semiconductor substrate 110a and has openings that partially expose the conductive pads 110b on the semiconductor substrate 110a. The semiconductor substrate 110a may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 110b may be aluminum pads, copper pads or other suitable metal pads. The passivation layer 110c may be a silicon oxide layer, a silicon nitride layer, a silicon oxynitride layer or a dielectric layer formed of any suitable dielectric materials. Furthermore, in some embodiments, the post-passivation layer 110d is optionally formed over the passivation layer 110c. The post-passivation layer 110d covers the passivation layer 110c and has a plurality of contact openings. The conductive pads 110b are partially exposed by the contact openings of the post passivation layer 110d. The post-passivation layer 110d may be a benzocyclobutene (BCB) layer, a polyimide layer, a polybenzoxazole (PBO) layer, or a dielectric layer formed by other suitable polymers. In some embodiments, the conductive posts or conductive pillars 110e are formed on the conductive pads 110b by plating. In some embodiments, the protection layer 110f is formed on the post passivation layer 110d covering the conductive posts or conductive pillars 110e so as to protect the conductive posts or conductive pillars 110e.

Referring to FIG. 1D, an insulating material 112 is formed on the backside connection structure 105 and over the active surface AS of the first semiconductor die 110. In some embodiments, the insulating material 112 is formed through, for example, a compression molding process, filling up the gaps between the first semiconductor die 110 and adjacent conductive pins 108. For example, the insulating material 112 encapsulates the joint structures 107, the conductive pins 108 and the first semiconductor die 110. Furthermore, the conductive pillars 110e are encapsulated by and well protected by the insulating material 112. In other words, the conductive pillars 110e of the first semiconductor die 110 are not revealed and are well protected by the insulating material 112. In some embodiments, the insulating material 112 includes epoxy resins or other suitable resins.

Referring to FIG. 1E, the insulating material 112 is partially removed to expose the conductive pillars 110e and the conductive pins 108. In some embodiments, the insulating material 112 and the protection layer 110f are ground or polished by a mechanical grinding process and/or a chemical mechanical polishing (CMP) process until the top surfaces 110T of the conductive pillars 110e are revealed. In some embodiments, the conductive pins 108 may be partially polished so that the top surfaces 108T of the conductive pins 108 are levelled with the top surfaces 110T of the conductive pillars 110e. The insulating material 112 is polished to form an insulating encapsulant 112'. In some embodiments, the top surface 112T of the insulating encapsulant 112' is coplanar with the top surfaces 108T of the conductive pins 108 and the top surfaces 110T of the conductive pillars 110e.

Figure 1F:
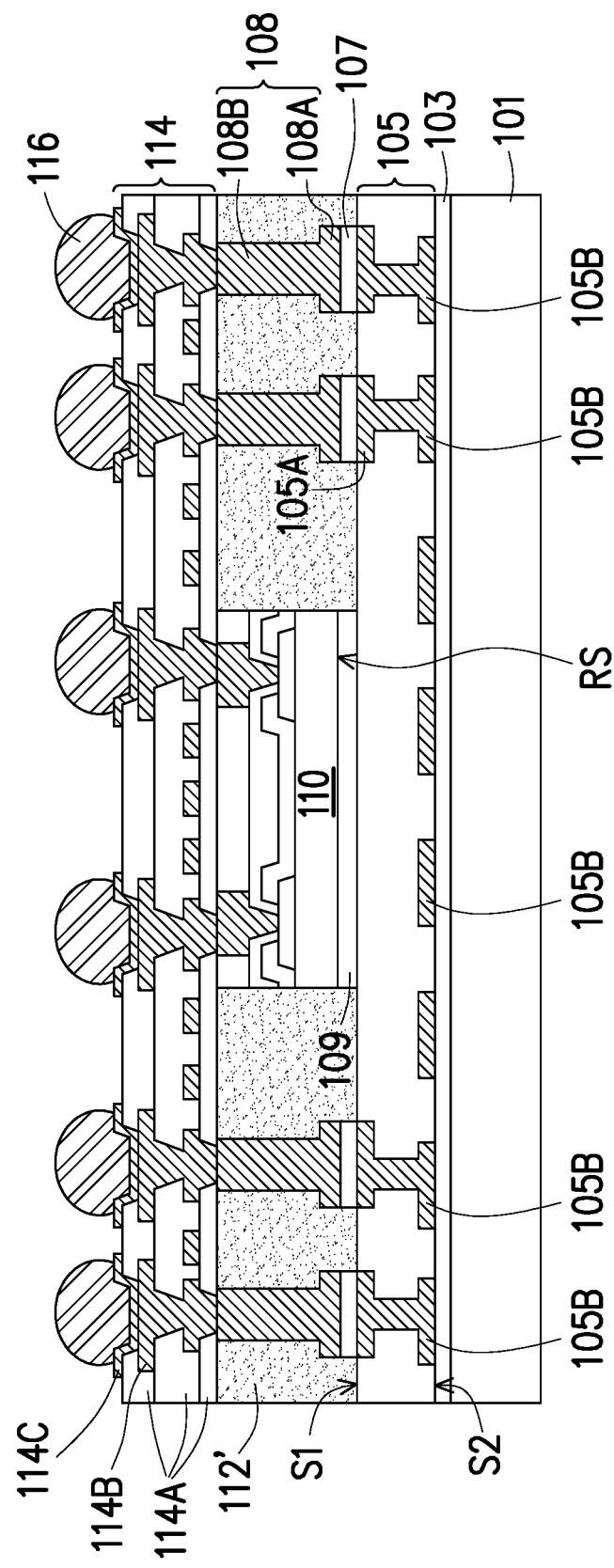

Referring to FIG. 1F, after forming the insulating encapsulant 112', a redistribution layer 114 may be formed on the insulating encapsulant 112'. In some embodiments, the redistribution layer 114 may include a plurality of dielectric layers 114A and a plurality of conductive elements 114B alternately stacked. Although only two layers of the conductive elements 114B and three layers of dielectric layers 114A are illustrated herein, however, the scope of the disclose is not limited by the embodiments of the disclosure. In other embodiments, the number of conductive elements 114B and the dielectric layers 114A may be adjusted based on product requirement. In the exemplary embodiment, the plurality of dielectric layers 114A may be made of non-organic or organic dielectric materials such as silicon oxide, silicon nitride, silicon carbide, silicon oxynitride, polyimide, benzocyclobutene (BCB), or the like, but the disclosure is not limited thereto. The plurality of conductive elements 114B may be made of copper, aluminum, nickel, or other suitable conductive materials, but the disclosure is not limited thereto. In some embodiments, the redistribution layer 114 may be formed by a semi-additive process (SAP), or through a damascene process. The redistribution layer 114 may be electrically connected to the first semiconductor die 110 and the plurality of conductive pins 108.

After forming the redistribution layer 114, a plurality of conductive balls 116 may be placed on the redistribution layer 114. In some embodiments, the topmost dielectric layers 114A of the redistribution layer 114 may include a plurality of conductive pads 114C. The conductive pads 114C are for example, under-ball metallurgy (UBM) patterns used for ball mount. In certain embodiments, the conductive balls 116 are placed on the conductive pads 114C through a ball placement process. In some embodiments, the conductive balls 116 are electrically connected to the first semiconductor die 110 through the conductive pads 114C and the conductive elements 114B of the redistribution layer 114.

Figure 1G:
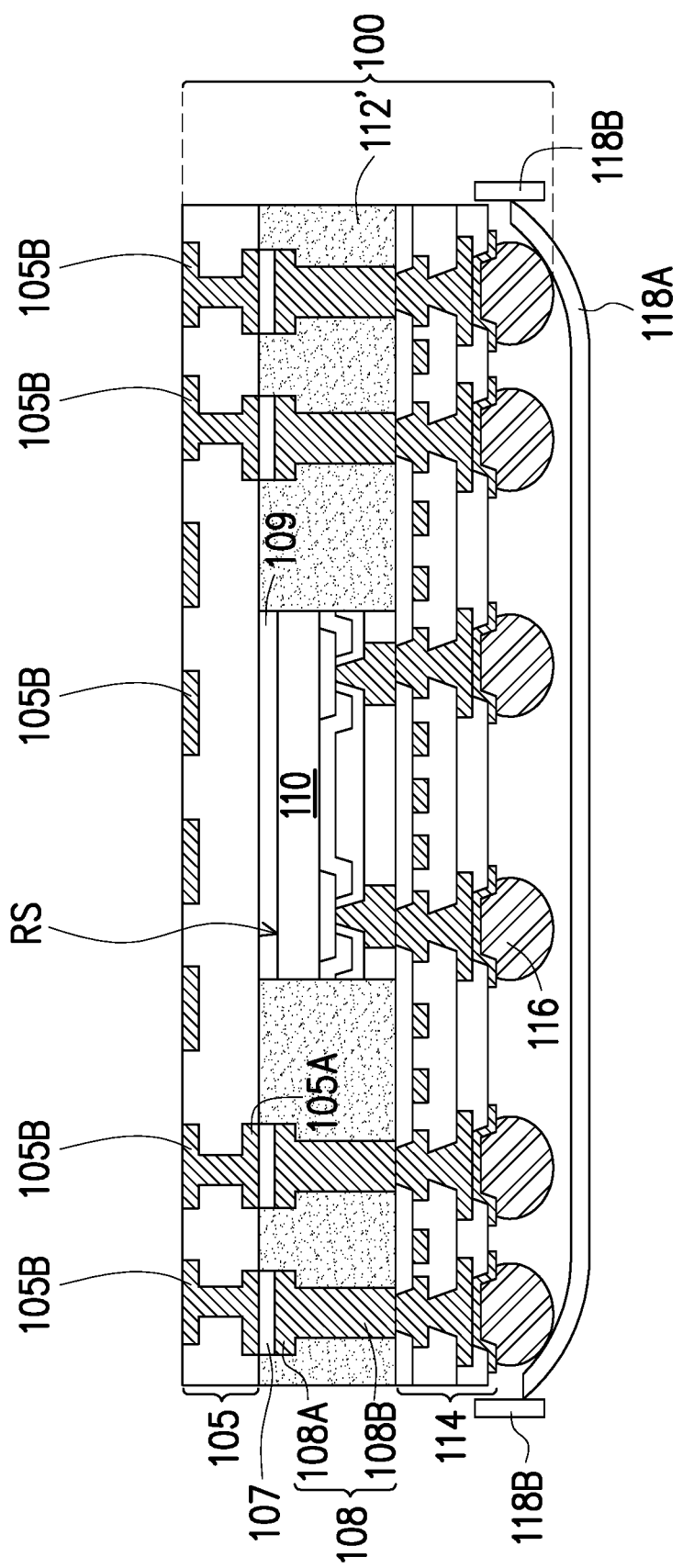

Referring to FIG. 1G, after forming the redistribution layer 114 and placing the conductive balls 116 thereon, the structure shown in FIG. 1F is turned upside down and attached to a tape 118A (e.g., a dicing tape 118A) supported by a frame 118B. In some embodiments, the carrier 101 is debonded so as to separate the first semiconductor die 110 and the de-bonding layer 103 from the carrier 101. In some embodiments, the de-bonding process include projecting a light such as a laser light or an UV light on the de-bonding layer 103, so that the carrier 101 can be easily removed. In certain embodiments, the de-bonding layer 103 may be further removed or peeled off. After the de-bonding process, the second connection layer 105B of the backside connection structure 105 is revealed. Up to here, a first package 100 in an embodiment of the disclosure is completed.

Figure 1H:
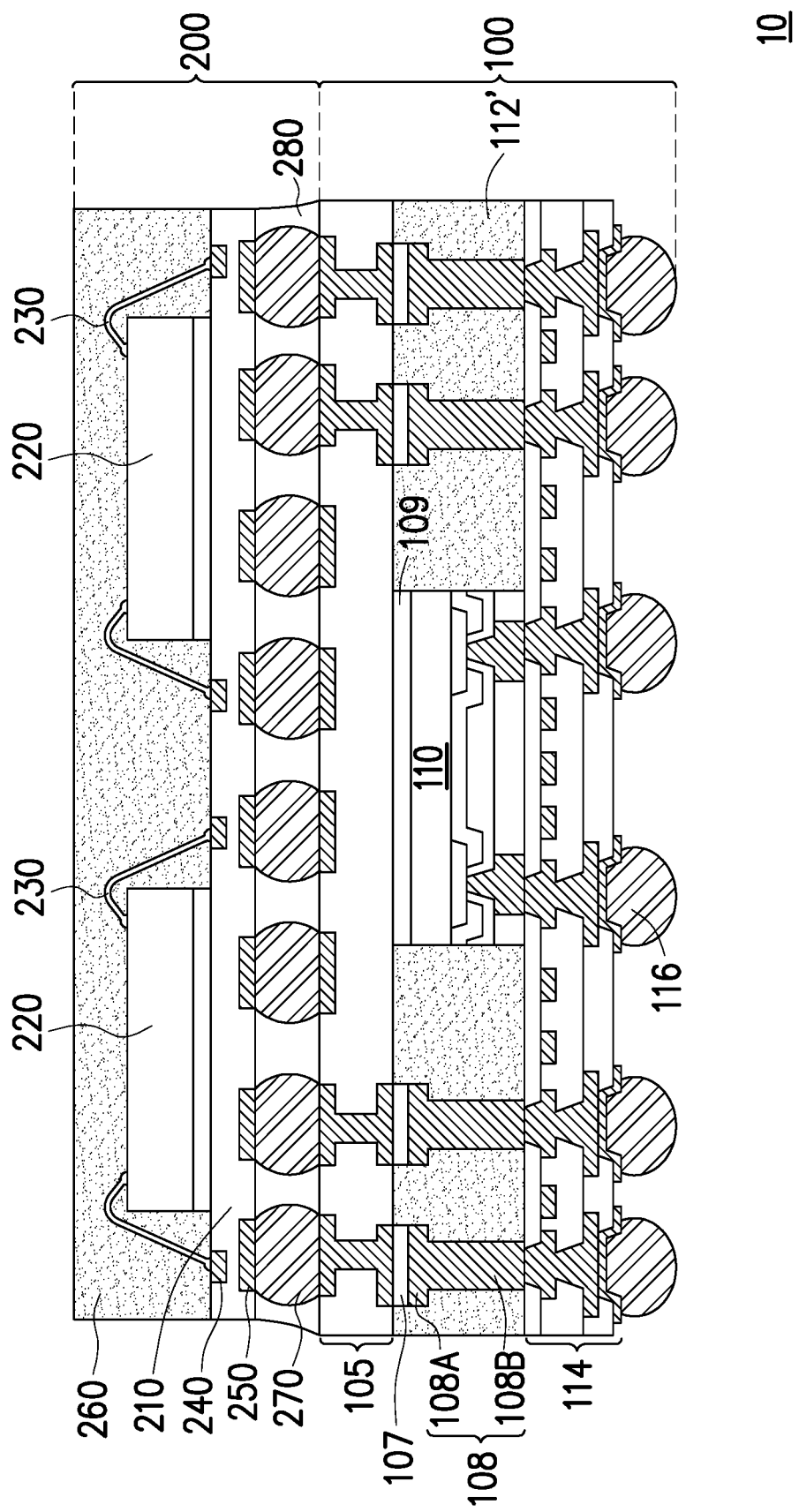

Referring to FIG. 1H, in a next step, a second package 200 is stacked or mounted on the first package 100. As illustrated in FIG. 1H, the second package 200 is electrically connected to the backside connection structure 105 of the first package 100 through a plurality of conductive balls 270. In the exemplary embodiment, the second package 200 has a substrate 210, a plurality of semiconductor chips 220 mounted on one surface (e.g. top surface) of the substrate 210. In some embodiments, the semiconductor chips 220 are logic chips (e.g., central processing unit, microcontroller, etc.), memory chips (e.g., dynamic random access memory (DRAM) chip, static random access memory (SRAM) chip, etc.), power management chips (e.g., power management integrated circuit (PMIC) chip), radio frequency (RF) chips, sensor chips, signal processing chips (e.g., digital signal processing (DSP) chips), front-end chips (e.g., analog front-end (AFE) chips, the like, or a combination thereof. In one embodiment, both of the semiconductor chips 220 may, for example, be DRAM chips, but the disclosure is not limited thereto. In some embodiments, bonding wires 230 are used to provide electrical connections between the semiconductor chips 220 and pads 240 (such as bonding pads). In some embodiments, an insulating encapsulant 260 is formed to encapsulate the semiconductor chips 220 and the bonding wires 230 to protect these components. In some embodiments, through insulator vias (not shown) may be used to provide electrical connection between the pads 240 and conductive pads 250 (such as bonding pads) that are located on another surface (e.g. bottom surface) of the substrate 210. In certain embodiments, the conductive pads 250 are electrically connected to the semiconductor chips 220 through these through insulator vias (not shown). In some embodiments, the conductive pads 250 of the second package 200 are electrically connected to the conductive pins 108 of the first package 100 through the conductive balls 270 that are sandwiched therebetween. In addition, an underfill structure 280 may fill up the gaps between the conductive balls 270 and encapsulate the conductive balls 270.

In the exemplary embodiment, the second package 200 is a wire bond type package, however, the disclosure is not limited thereto. In the current embodiment, and in the successive embodiments, the second package 200 may be designed based on product requirement. For example, in certain embodiments, the second package 200 may be a flip chip ball grid array (BGA) type package, or a fan-out wafer level package (WLP), the disclosure is not limited thereto.

After stacking the second package 200 on the first package 100 and providing electrical connection between the packages through the conductive balls 270, a package-on-package structure 10 can be fabricated. In some embodiments, a dicing process may be performed to cut the whole package structure into individual packages. In the illustrated embodiment, although wire bonding is shown as the method for connecting the semiconductor chips 220 of the second package 200 to the backside connection structure 105 of the first package 100, however, the disclosure is not limited thereto. In some alternative embodiments, the semiconductor chips 220 of the second package 200 may be directly connected to the backside connection structure 105 through controlled collapse chip connection (C4) bumps, microbumps, or through hybrid bonding.

Figure 2A:
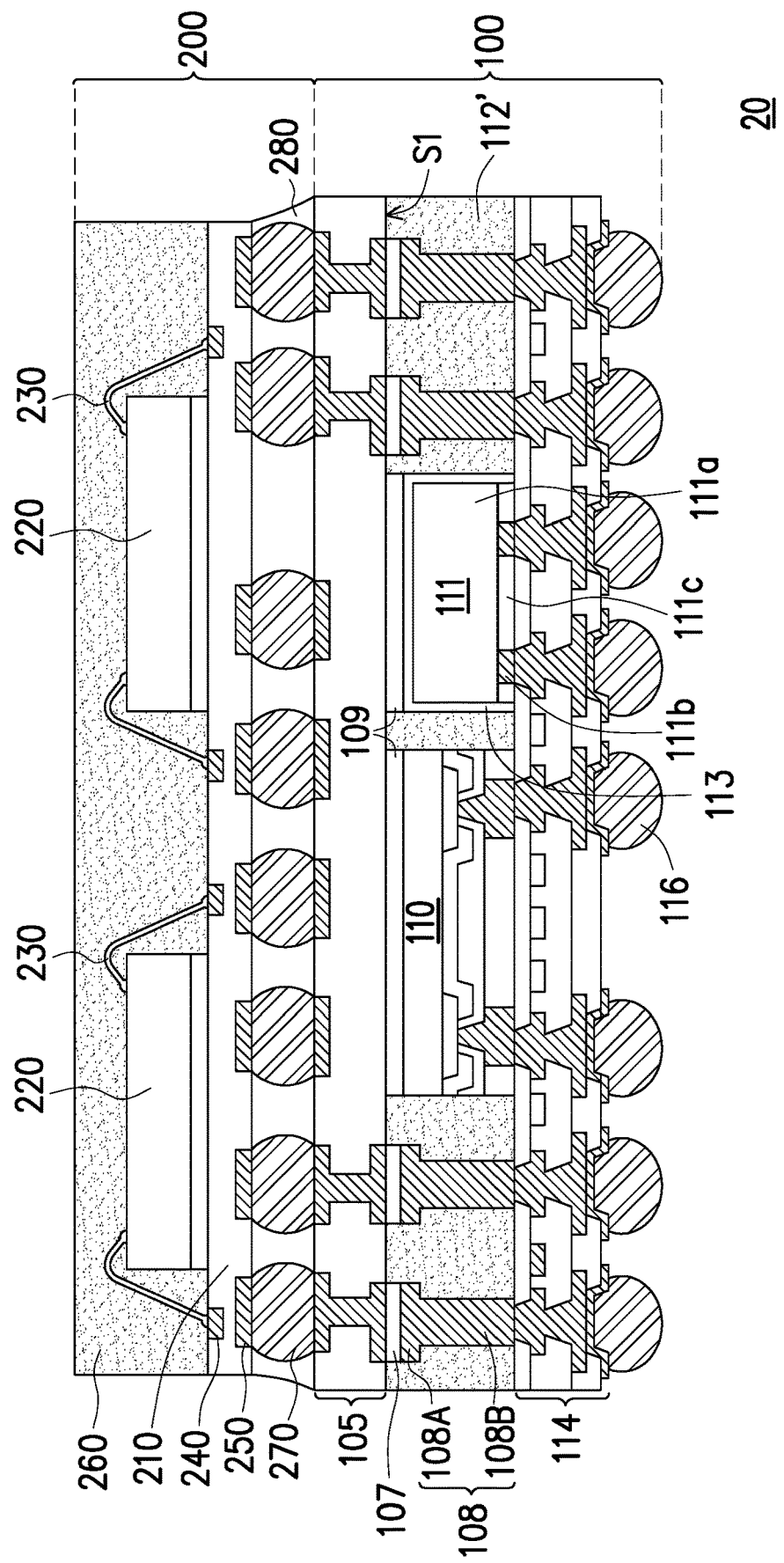
FIGS. 2A and 2B are schematic cross-sectional views of a package-on-package (PoP) structure according to some exemplary embodiments of the present disclosure.
Figure 2B:
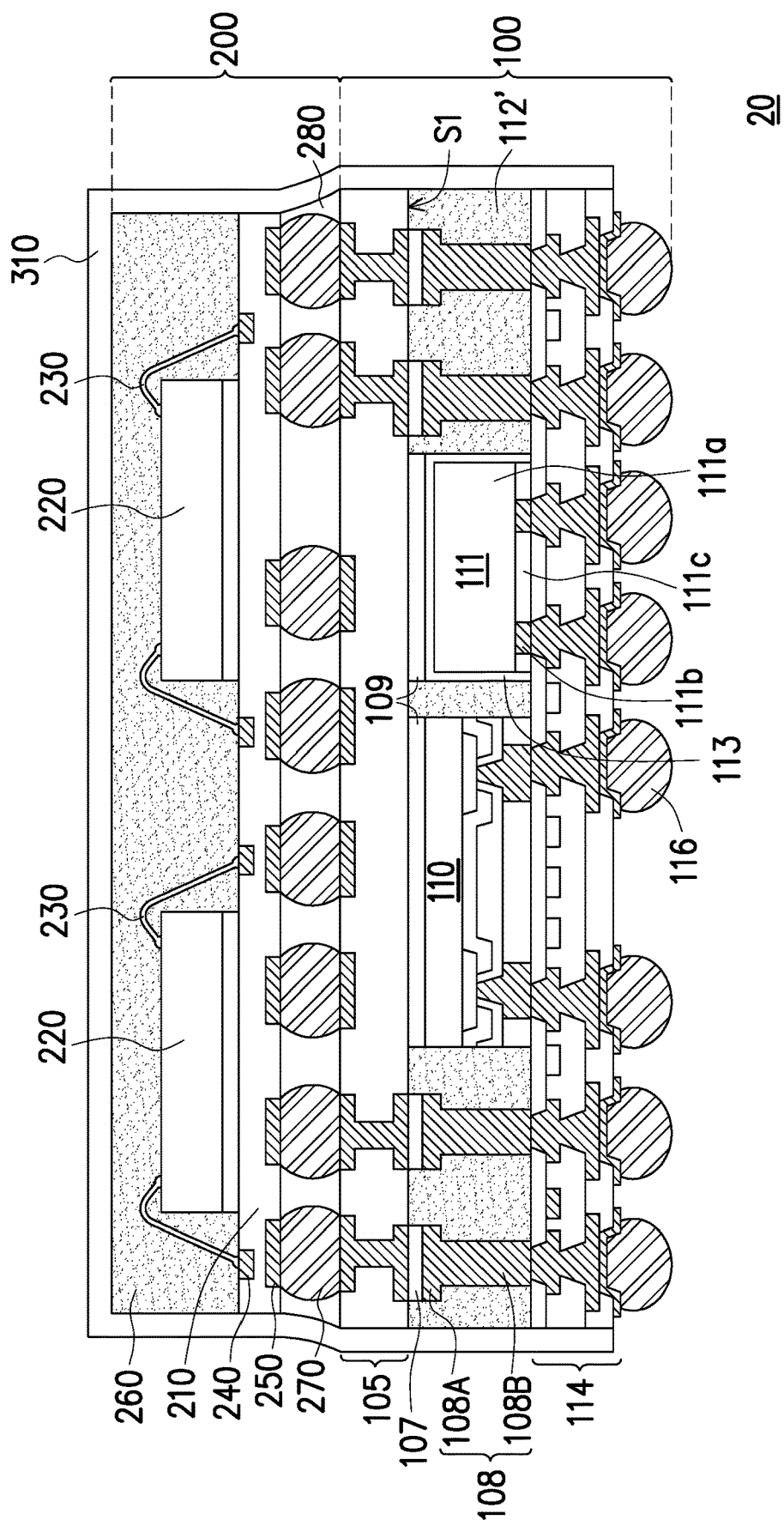

FIGS. 2A and 2B are schematic cross-sectional view of a package-on-package (PoP) structure according to some exemplary embodiments of the present disclosure. The package-on-package structure 20 shown in FIG. 2A is similar to the package-on-package structure 10 shown in FIG. 1H. Hence, the same reference numerals will be used to refer to the same or liked parts, and their detailed description will not be repeated herein. The difference between the embodiment of FIG. 2A and the embodiment of FIG. 1H is that a second semiconductor die 111 is provided. In the illustrated embodiment, the second semiconductor die 111 is attached to the backside connection structure 105 through an adhesive layer 109 (die attach film). For example, the second semiconductor die 111 is disposed on the first surface S1 of the backside connection structure 105 adjacent to the first semiconductor die 110.

As illustrated in FIG. 2A the second semiconductor die 111, for example, includes a semiconductor substrate 111a, a plurality of conductive posts or conductive pillars 111b, and a protection layer 111c. The semiconductor substrate 111a, the conductive pillars 111b and the protection layer 111c described herein may be similar to the semiconductor substrate 110a, the conductive pillars 110e and the protection layer 110f described in the embodiment of FIG. 1A to FIG. 1H. Therefore, its description will not be repeated herein. Note that the second semiconductor die 111 may further include conductive pads, passivation layer, post-passivation layers that are similar to the elements described in the first semiconductor die 110. However, these elements are omitted from the figures for simplification purposes. In addition, in some embodiments, a local shielding structure 113 is provided to surround the second semiconductor die 111. For example, the local shielding structure 113 may be used for electromagnetic interference (EMI) shielding. In some embodiments, a material of the local shielding structure 113 may include conductive materials such as copper, nickel, conductive polymers, the like, or a combination thereof. However, the materials of the local shielding structure 113 are not limited thereto. Furthermore, as shown in FIG. 2A, the second semiconductor die 111 is further encapsulated by the insulating encapsulant 112', surrounded by the conductive pins 108, and being electrically connected to the redistribution layer 114.

Subsequently, referring to FIG. 2B, a global shielding structure 310 may be provided to shield the entire package-on-package structure 20 from interference. In some embodiments, a material of the global shielding structure 310 may include conductive materials such as copper, nickel, conductive polymers, the like, or a combination thereof. However, the materials of the global shielding structure 310 are not limited thereto. In certain embodiments, the global shielding structure 310 may conformally cover the first package 100 and the second package 200.

Figure 3A:
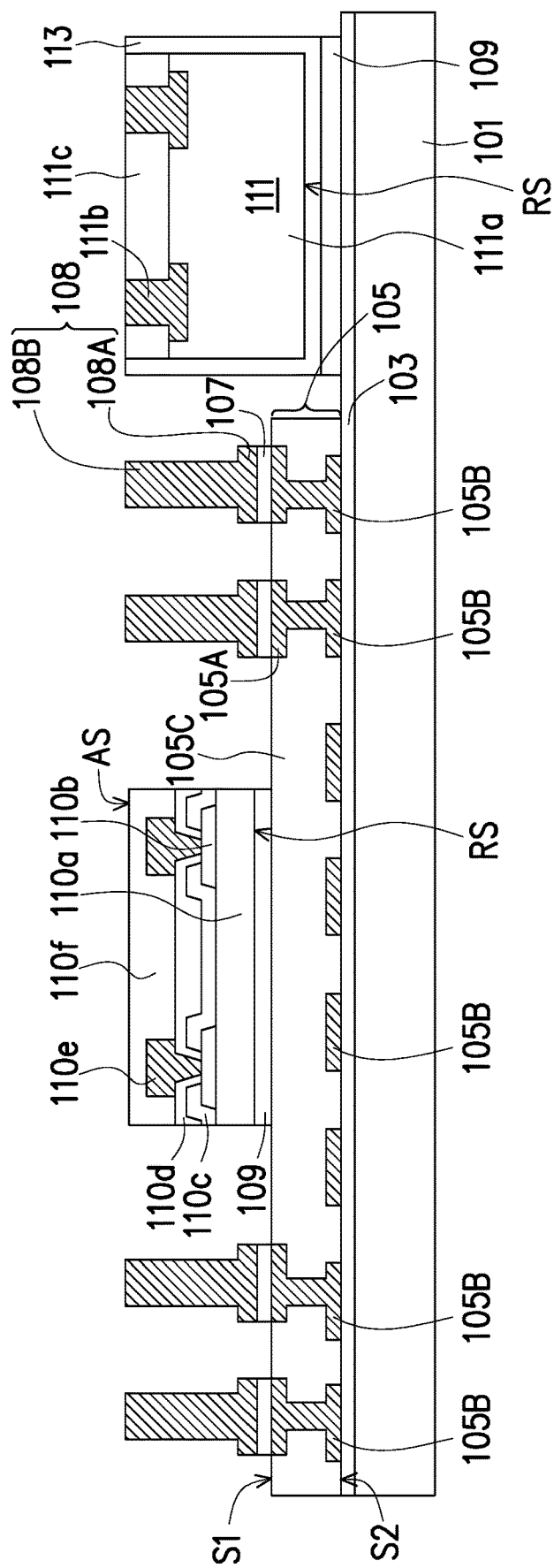
FIG. 3A to FIG. 3E are schematic cross-sectional views of various stages in a manufacturing method of a package-on-package (PoP) structure according to some exemplary embodiments of the present disclosure.

FIG. 3A to FIG. 3E are schematic cross-sectional views of various stages in a manufacturing method of a package-on-package (PoP) structure according to some exemplary embodiments of the present disclosure. The package-on-package structure 30 shown in FIG. 3A to FIG. 3E is similar to the package-on-package structure 20 shown in FIG. 2A and FIG. 2B. Hence, the same reference numerals will be used to refer to the same or liked parts, and their detailed description will not be repeated herein. The difference between the embodiment of FIG. 3A to FIG. 3E and the embodiment of FIG. 2A and FIG. 2B is that the second semiconductor die 111 is disposed aside of the backside connection structure 105. As illustrated in FIG. 3A, after disposing the first semiconductor die 110 on the backside connection structure 105 (step shown in FIG. 1C), a large second semiconductor die 111 is disposed directly on the carrier 101 aside of the backside connection structure 105. In some embodiments, the second semiconductor die 111 is disposed on the carrier 101 through an adhesive layer 109.

Figure 3B:
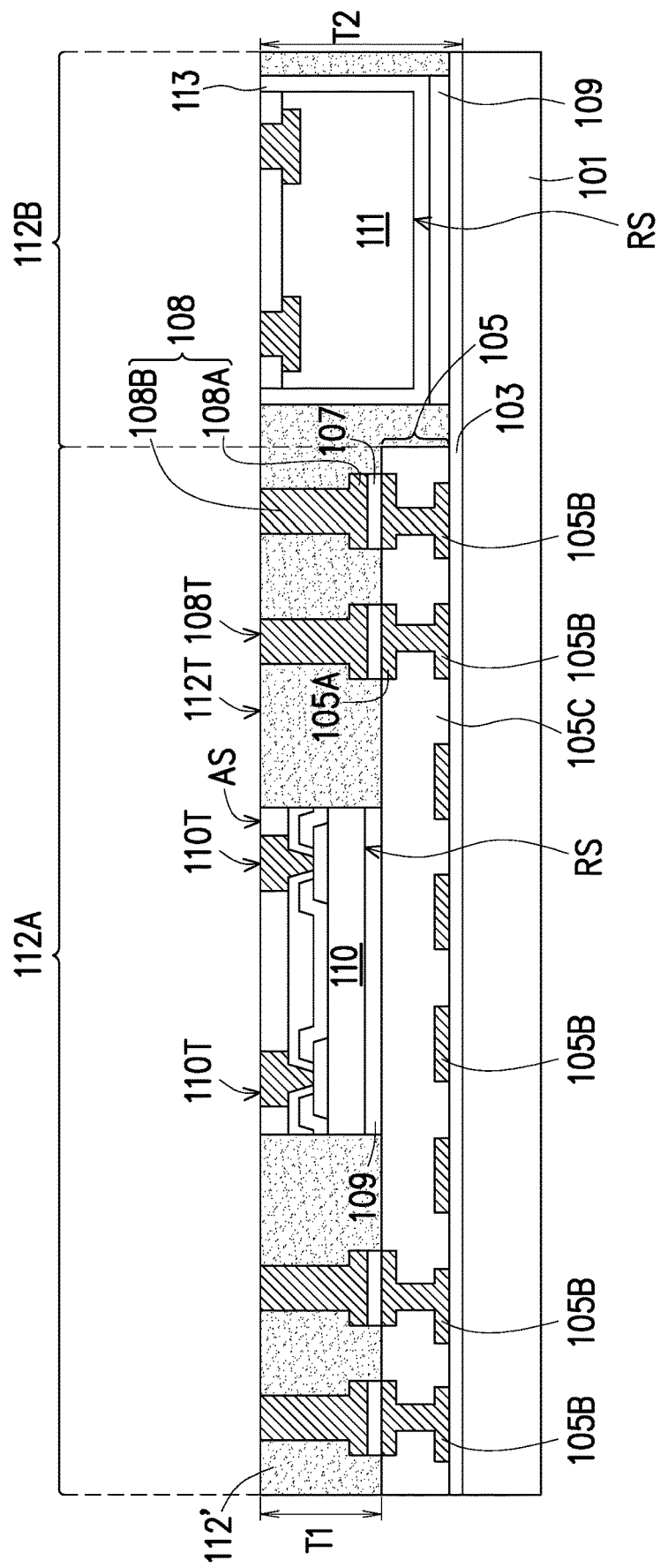

Referring to FIG. 3B, after disposing the first semiconductor die 110 and the second semiconductor die 111, an insulating encapsulant 112' is formed (using the same steps described in FIG. 1D to FIG. 1E) to encapsulate the first semiconductor die 110 and the second semiconductor die 111. In the illustrated embodiment, the insulating encapsulant 112' has a first region 112A with a first thickness T1, and a second region 112B with a second thickness T2. The second thickness T2 is greater than the first thickness T1. Furthermore, as shown in FIG. 3B, the first semiconductor die 110 is encapsulated by the insulating encapsulant 112' in the first region 112A, while the second semiconductor die 111 is encapsulated by the insulating encapsulant 112' in the second region 112B.

Figure 3C:
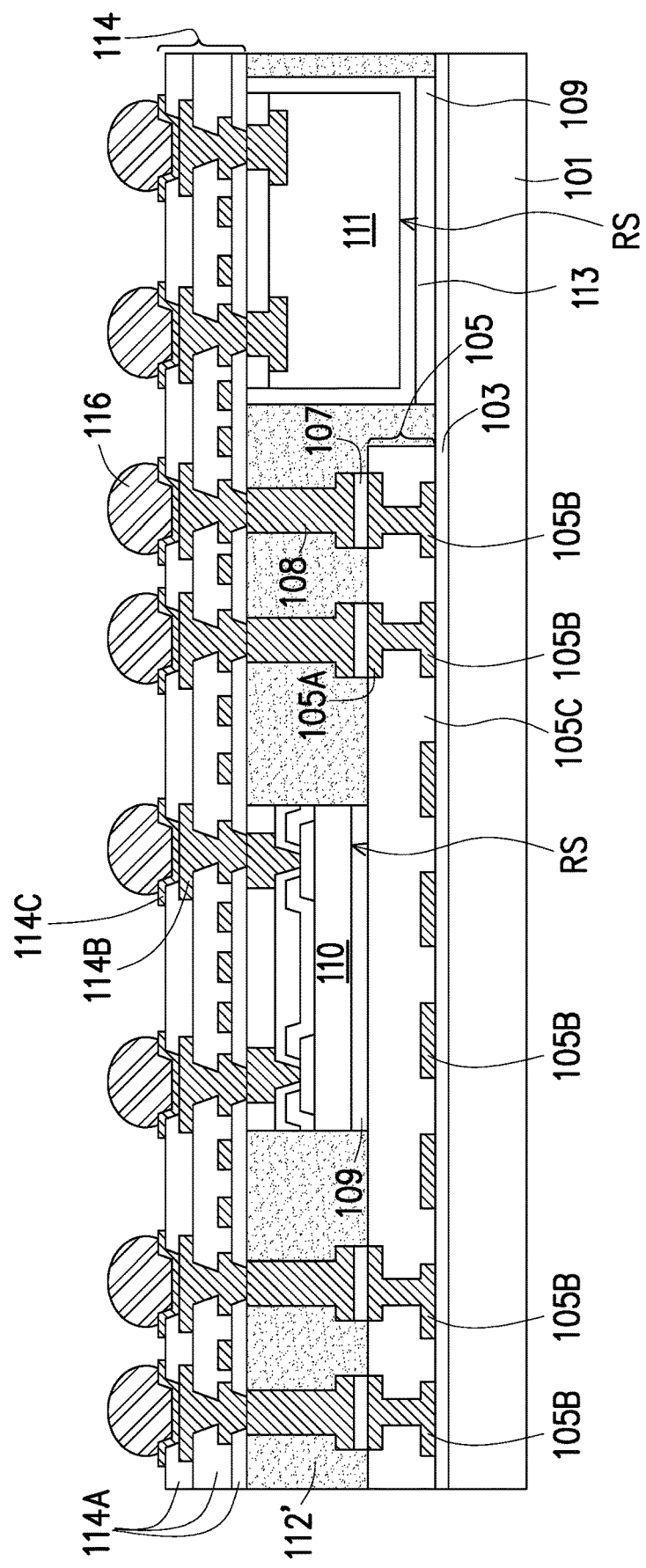
Figure 3D:
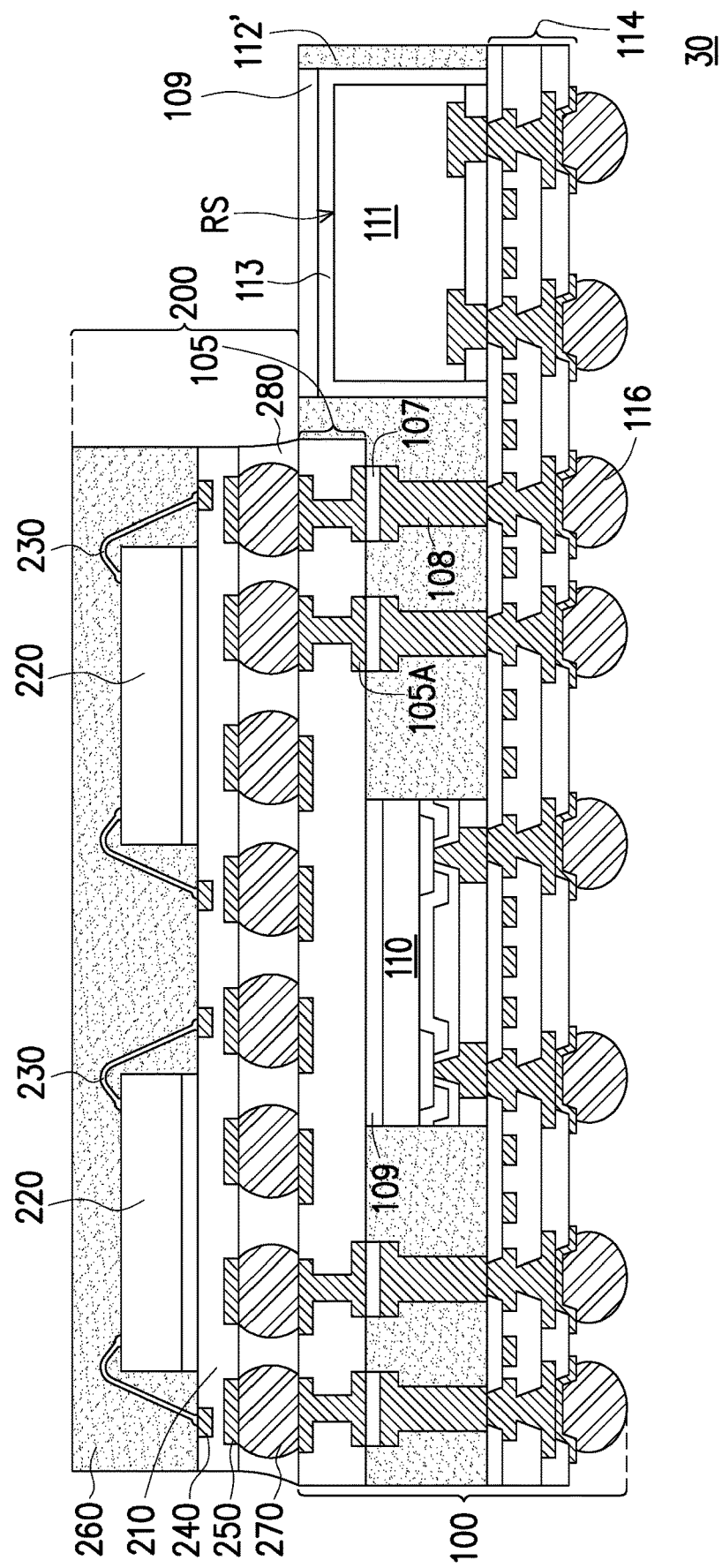
Figure 3E:
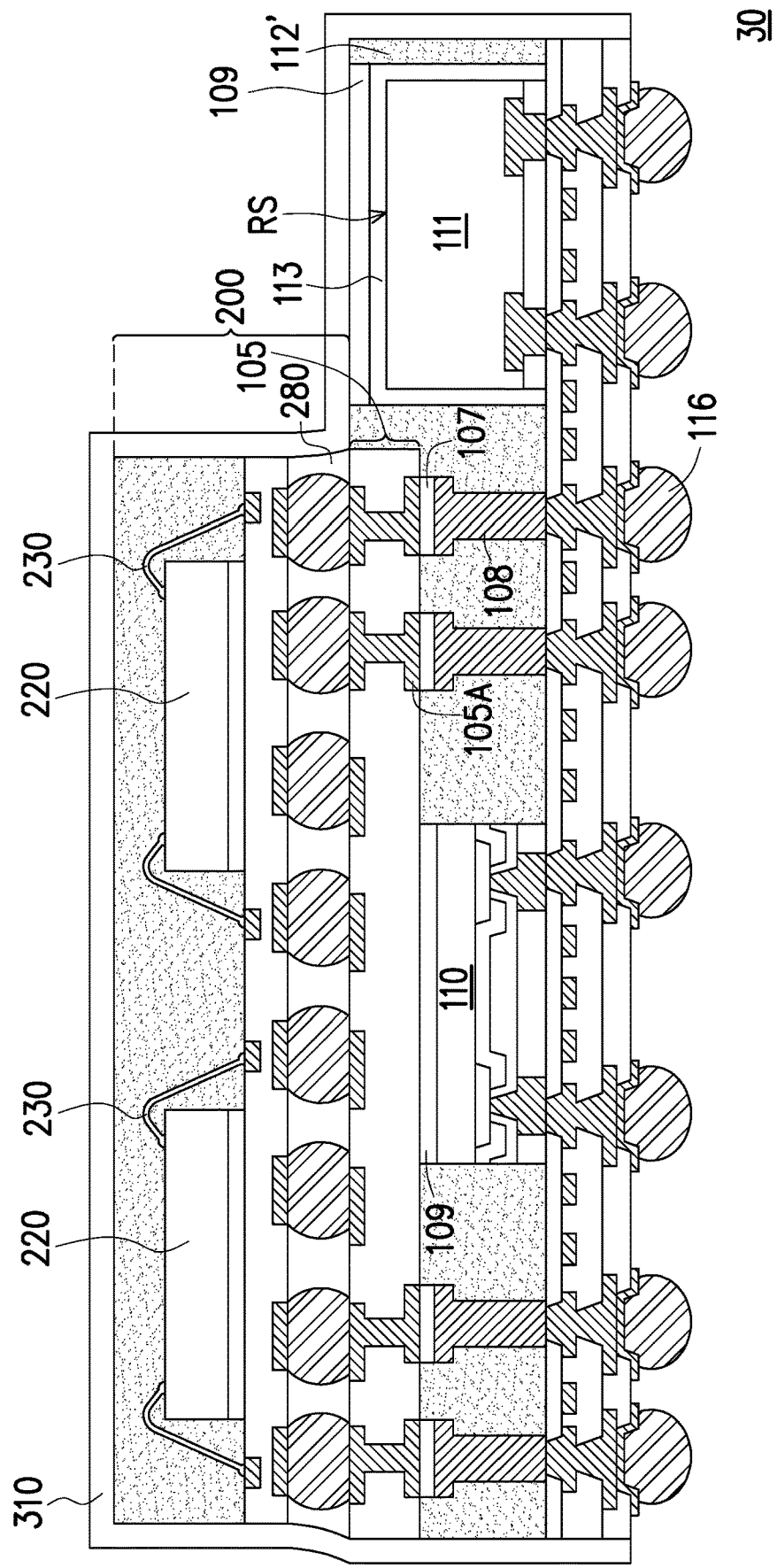

Subsequently, as shown in FIG. 3C, a redistribution layer 114 is formed on the insulating encapsulant 112 and over the first semiconductor die 110 and the second semiconductor die 111. In some embodiments, the redistribution layer 114 is electrically connected to the first semiconductor die 110 and the second semiconductor die 111. Additionally, a plurality of conductive balls 116 may be placed on the conductive pads 114C of the redistribution layer 114 through a ball placement process. The same de-bonding steps (FIG. 1G) and mounting of the second package 200 on the first package 100 (FIG. 1H) may be performed to arrive at the package-on-package structure 30 shown in FIG. 3D. As illustrated in FIG. 3D, in some embodiments, the second package 200 may be stacked on the first package 100 and being electrically connected to the second connection layer 105B of the backside connection structure 105 through the conductive balls 270. In other words, the second package 200 may be overlapped with the first semiconductor die 110, and not overlapped with the second semiconductor die 111. In some embodiments, as shown in FIG. 3E, a global shielding structure 310 may be provided to shield the entire package-on-package structure 30 from interference. In some embodiments, a material of the global shielding structure 310 may include conductive materials such as copper, nickel, conductive polymers, the like, or a combination thereof. However, the materials of the global shielding structure 310 are not limited thereto. In certain embodiments, the global shielding structure 310 may conformally cover the first package 100 and the second package 200.

Figure 4A:
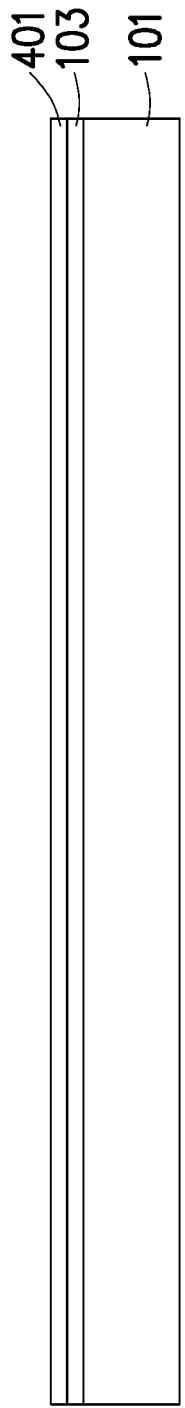
FIG. 4A to FIG. 4H are schematic cross-sectional views of various stages in a manufacturing method of a package-on-package (PoP) structure according to some exemplary embodiments of the present disclosure.

FIG. 4A to FIG. 4H are schematic cross-sectional views of various stages in a manufacturing method of a package-on-package (PoP) structure according to some exemplary embodiments of the present disclosure. The embodiment shown in FIG. 4A to FIG. 4H is similar to the embodiment shown in FIG. 1A to FIG. 1H. Hence, the same reference numerals are used to refer to the same or liked parts, and its detailed description will not be repeated herein. As shown in FIG. 4A, a carrier 101 with a de-bonding layer 103 coated thereon is provided. In some embodiments, a polymer layer 401 is disposed on the de-bonding layer 103. The polymer layer 401 may, for example, be formed of materials such as polyimide (PI), polybenzooxazole (PBO), or any other suitable polymer-based dielectric material.

Figure 4B:
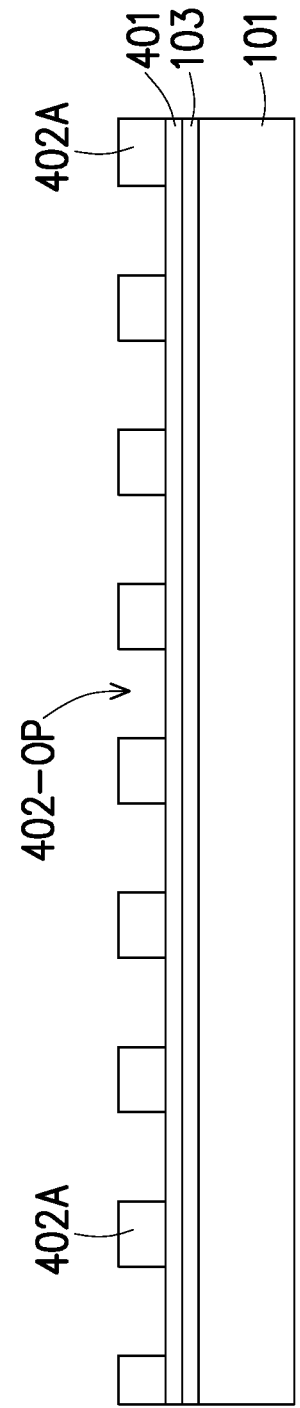

Referring to FIG. 4B, after forming the polymer layer 401, a patterned dielectric layer 402A may be formed on the polymer layer 401. The dielectric layer 402A, for example, may be formed by suitable fabrication techniques such as spin-on coating, chemical vapor deposition (CVD), plasma-enhanced chemical vapor deposition (PECVD), or the like. In some embodiments, the dielectric layer 402A may be patterned to form openings 402-OP. In some embodiments, a material of the dielectric layer 402A includes polyimide (PI), epoxy resin, acrylic resin, phenol resin, benzocyclobutene (BCB), polybenzooxazole (PBO), or any other suitable polymer-based dielectric material. The material of the dielectric layer 402A and the polymer layer 401 may be the same or different.

Figure 4C:
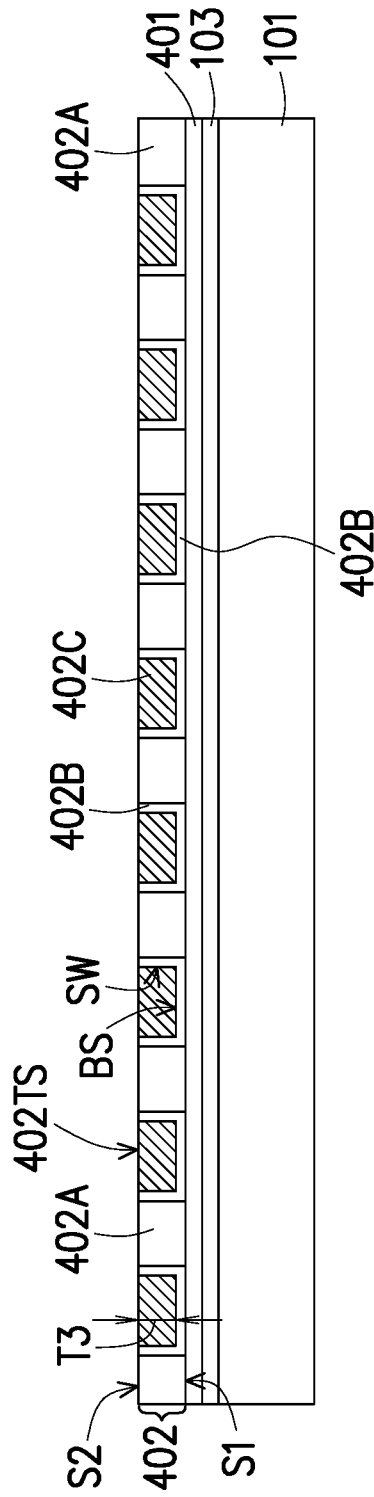

Referring to FIG. 4C, after forming the dielectric layer 402A, a seed layer 402B is formed in the openings 402-OP of the dielectric layer 402A, and a plurality of connection pads 402C is formed above the seed layer 402B. For example, in one embodiment, a method of forming the seed layer 402B and the connection pads 402C includes: conformally forming a seed layer over the surface of the dielectric layer 402A and in the openings 402-OP; forming a conductive material over the seed layer and the dielectric layer 402A; and performing a planarization process (for example, through CMP) to remove portions of the conductive material and the seed layer to define the seed layer 402B and the connection pads 402C. In the exemplary embodiment, after the planarization process, the seed layer 402B is formed to cover the sidewalls SW and a bottom surface BS of the connection pad 402C. In other words, the seed layer 402B is disposed in between the dielectric layer 402A and the connection pads 402C, wherein the dielectric layer 402A surrounds the seed layer 402B and the connection pads 402C. In some embodiments, the connection pads 402C is formed to include pads and metal traces (not shown) therein.

In the exemplary embodiment, the seed layer 402B is formed conformal to the profiles of the openings 402-OP (shown in FIG. 4B) of the dielectric layer 402A. In other words, the seed layer 402B conformally covers the sidewalls and bottom surfaces of the openings 402-OP of the dielectric layer 402A. In some embodiments, the seed layer 402B is formed by electroless plating, chemical vapor deposition (CVD), physical vapor deposition (PVD), atomic layer deposition (ALD), high density plasma CVD (HDPCVD) or combinations thereof. In certain embodiments, the seed layer 402B is formed by sequentially depositing or sputtering a titanium layer and a copper layer (not shown). After forming the seed layer 402B, the connection pads 402C may be formed on the seed layer 402B to fill up the opening 402-OP of the dielectric layer 402A. In some embodiments, the formation of the connection pads 402C includes forming a copper layer or a copper alloy layer on the seed layer 402B to fill up the opening 402-OP of the dielectric layer 402A. In some embodiments, the connection pads 402C have a thickness of 30 μm or less. In certain embodiments, the connection pads 402C may have a thickness in between 5 μm to 30 μm.

As illustrated in FIG. 4C, the dielectric layer 402A, the seed layer 402B and the connection pads 402C constitute a backside connection structure 402. In some embodiments, the backside connection structure. 402 may have a first surface S1 and a second surface S2 opposite to the first surface S1. The first surface S1 may, for example, be in contact with the polymer layer 401, whereas the second surface S2 faces away from the polymer layer 401. Furthermore, in some embodiments, the seed layers 402B disposed on the bottom surface BS of the connection pads 402C are revealed from the first surface S1 of the backside connection structure 402, whereas a top surface 402TS of the connection pads 402C is revealed from the second surface S2 of the backside connection structure 402. In certain embodiments, the reveled surface of the seed layers 402B disposed on the bottom surface BS of the connection pads 402C are substantially coplanar with the first surface S1 of the backside connection structure 402, whereas the top surface 402TS of the connection pads 402C are substantially coplanar with the second surface S2 of the backside connection structure 402.

Figure 4D:
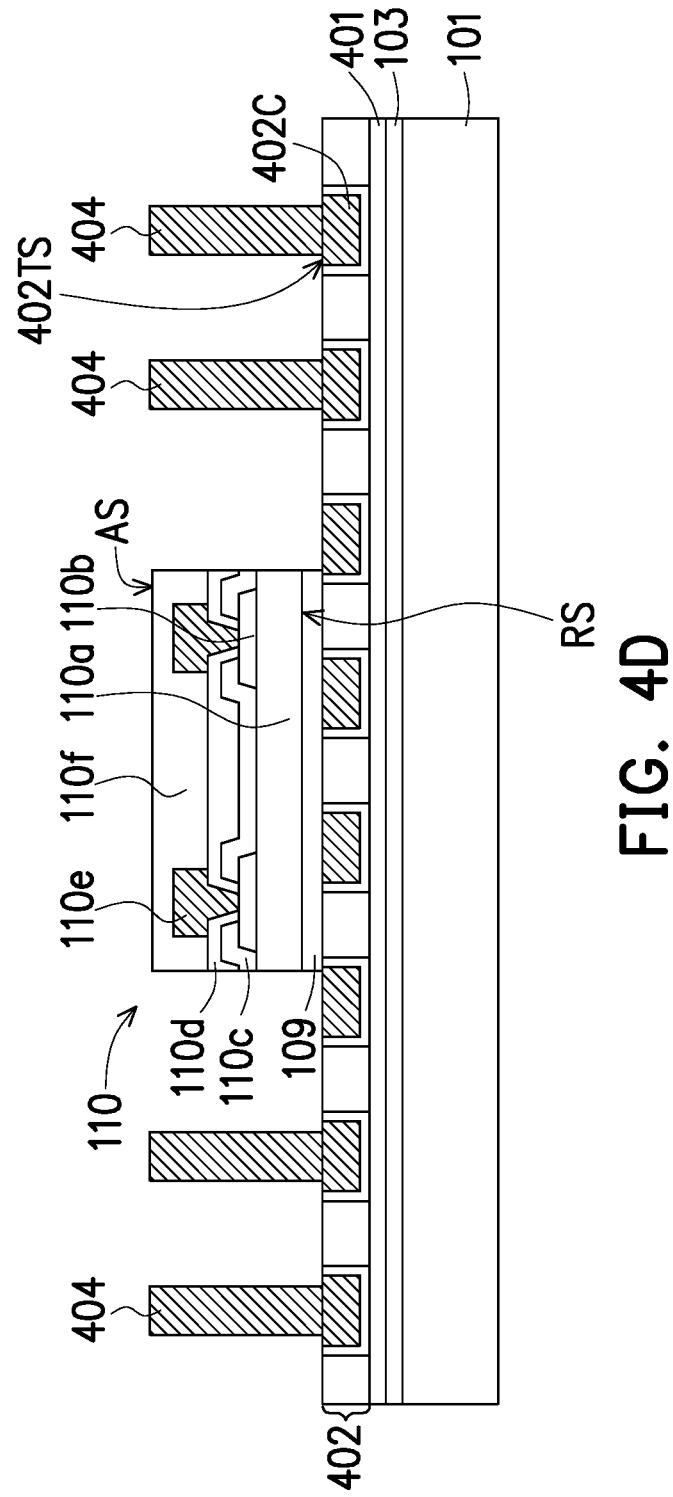

Referring to FIG. 4D, a plurality of through insulator vias 404 is formed on the backside connection structure 402 and over the carrier 101, and a first semiconductor die 110 is bonded on the backside connection structure 402. Referring to FIG. 4D, in some embodiments, the through insulator vias 404 are through integrated fan-out ("InFO") vias. In some embodiments, the formation of the through insulator vias 404 includes forming a mask pattern (not shown) with openings, then forming a metallic material (not shown) filling up the openings by electroplating or deposition, and removing the mask pattern to form the through insulator vias 404 on the backside connection structure 402. In certain embodiments, a seed layer (not shown) may be formed before filling the metallic material and is located between the through insulator vias 404 and the connection pads 402C of the backside connection structure 402. The material of the seed layer varies depending on the material of the later-formed through insulator vias 404. In some embodiments, the material of the through insulator vias 404 may include copper or copper alloys. In certain embodiments, the through insulator vias 404 are copper pillars. Furthermore, the through insulator vias 404 may be electrically connected to the top surface 402TS of the connection pads 402C.

In some embodiments, the first semiconductor die 110 may be picked and placed on the backside connection structure 402. The first semiconductor die 110 may be attached to the backside connection structure 402 through an adhesive layer 109. The first semiconductor die 110 and the adhesive layer 109 is the same as described in the embodiment of FIG. 1A to FIG. 1H, hence its description will not be repeated herein. In some embodiments, a plurality of the first semiconductor dies 110 may be placed on the backside connection structure 402 and arranged in an array, and when the first semiconductor dies 110 are arranged in an array, the through insulator vias 404 may be classified into groups. The number of the first semiconductor die 110 may correspond to the number of the groups of the through insulator vias 404.

Figure 4E:
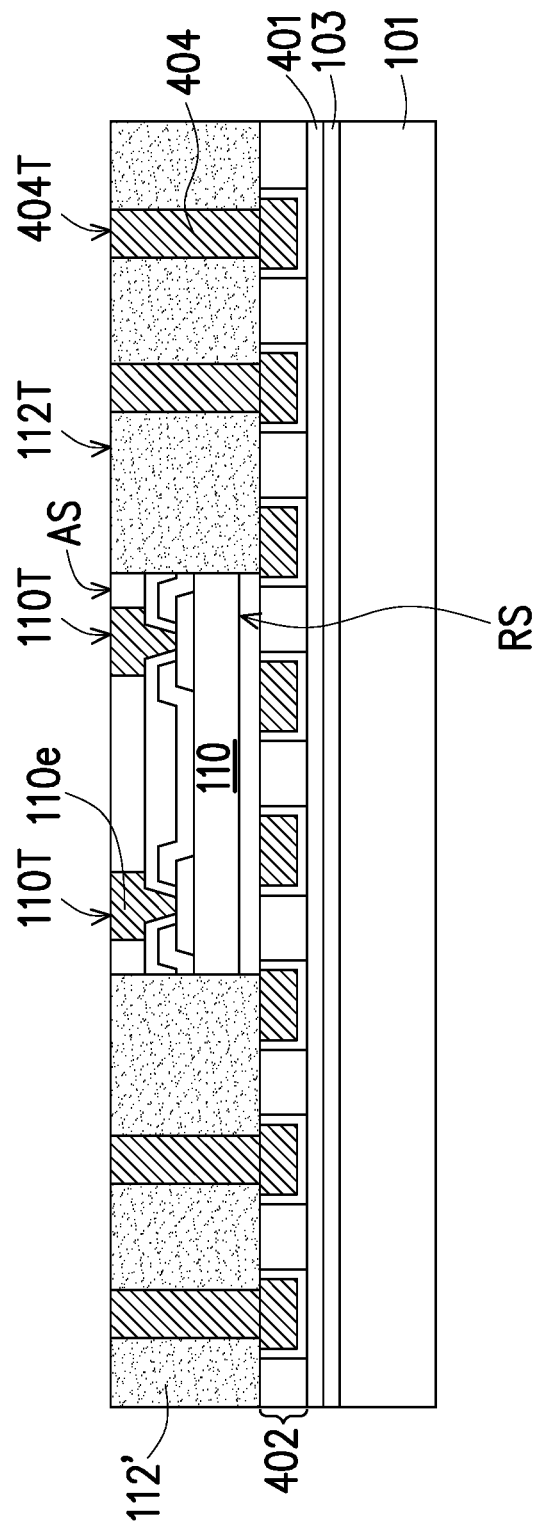

Referring to FIG. 4E, after forming the through insulator vias 404 and providing the first semiconductor die 110, an insulating encapsulant 112' is formed (using the same steps described in FIG. 1D to FIG. 1E) to encapsulate the first semiconductor die 110 and the through insulator vias 404. For example, an insulating layer (not shown) is formed to cover the through insulator vias 404 and the first semiconductor die 110. Subsequently, a planarization step is performed to remove portions of the insulating layer, and to remove portions of the protection layer 110f so that the conductive pillars 110b are revealed. In the illustrated embodiment, after performing the planarization step, the top surface 112T of the insulating encapsulant 112' is substantially coplanar with the top surface 110T of the conductive pillars 110b, and the top surface 404T of the through insulator vias 404.

Figure 4F:
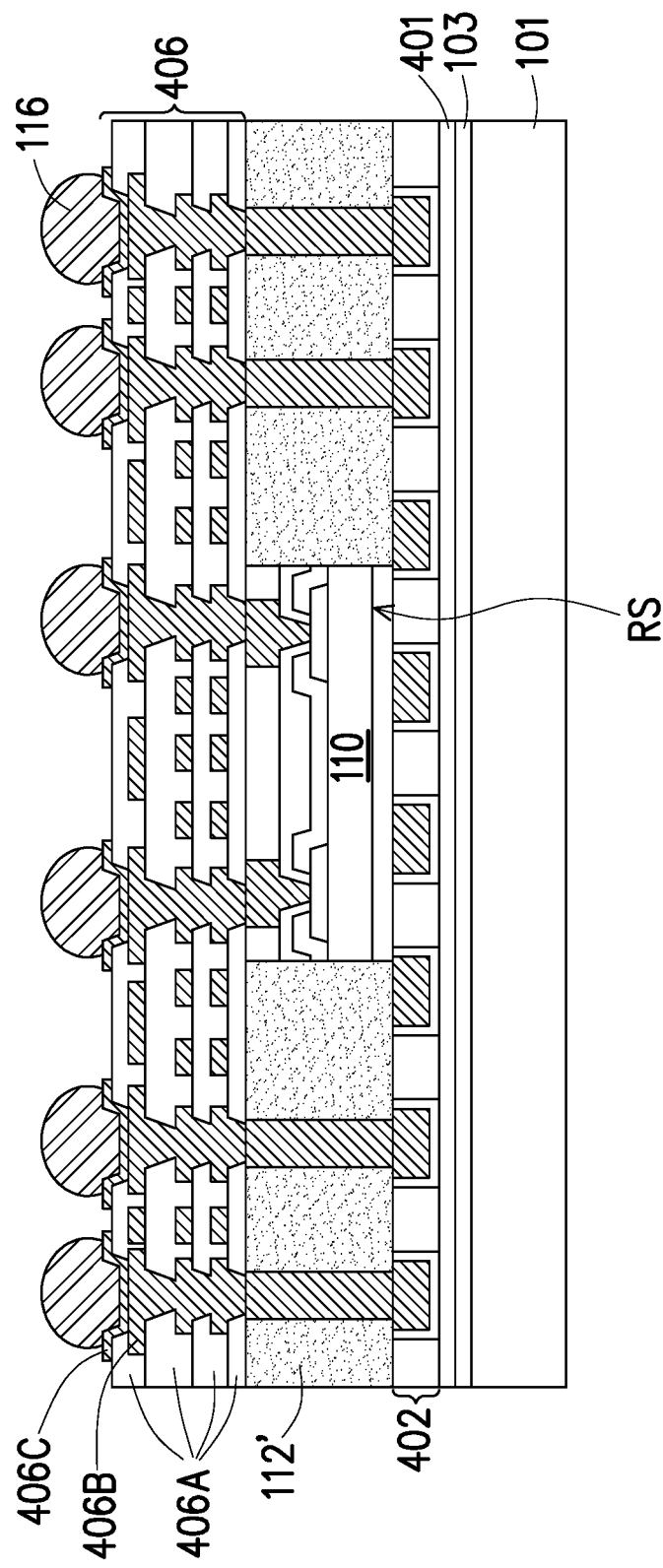

Referring to FIG. 4F, after forming the insulating encapsulant 112', a redistribution layer 406 may be formed on the insulating encapsulant 112'. In some embodiments, the redistribution layer 406 may include a plurality of dielectric layers 406A and a plurality of conductive elements 406B alternately stacked. The redistribution layer 406 may be formed by using a similar method as described for the formation of the redistribution layer 114 in FIG. 1F. In some embodiments, the redistribution layer 406 may be formed by a semi-additive process (SAP), or through a damascene process. In the exemplary embodiments, a plurality of conductive balls 116 may be placed on the redistribution layer 406. In some embodiments, the topmost dielectric layers 406A of the redistribution layer 406 may include a plurality of conductive pads 406C. The conductive pads 406C are for example, under-ball metallurgy (UBM) patterns used for ball mount.

Figure 4G:
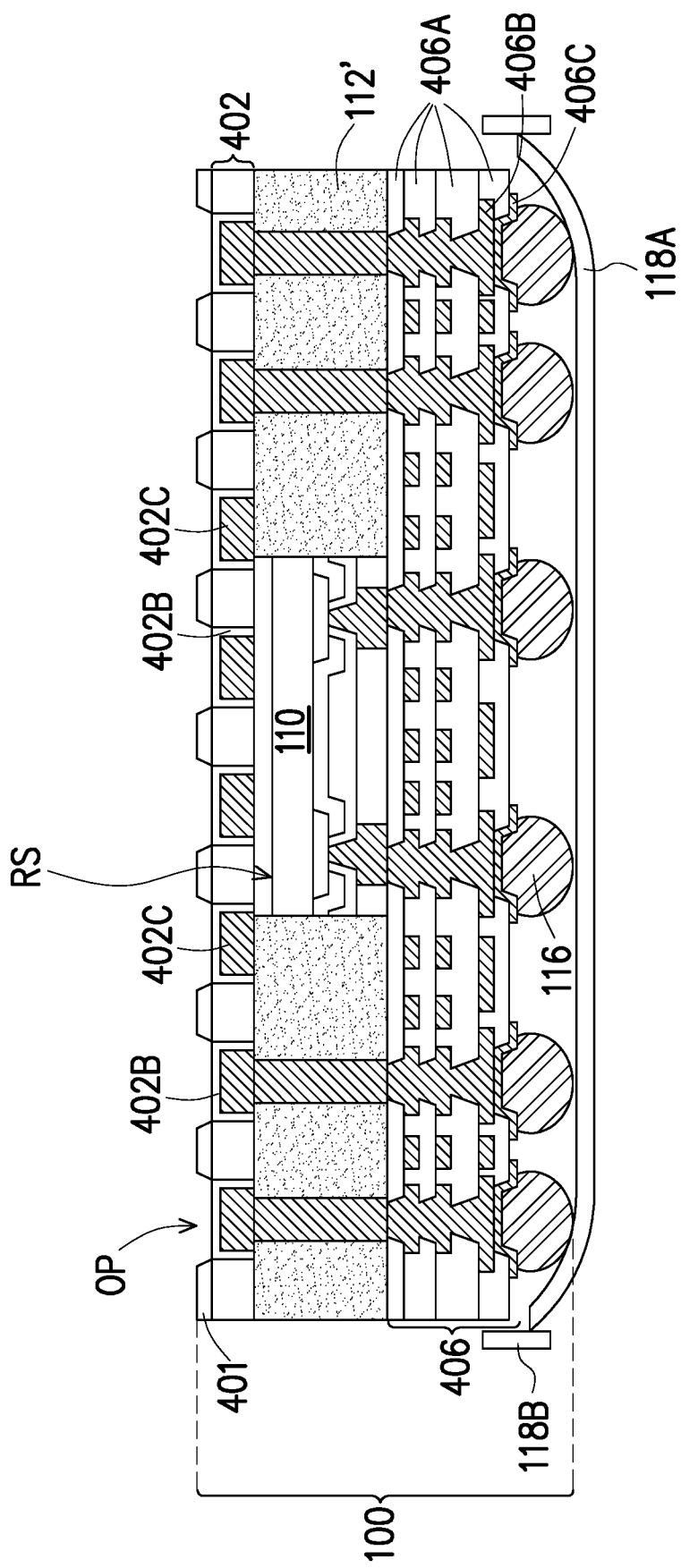

Referring to FIG. 4G, after forming the redistribution layer 406 and placing the conductive balls 116 thereon, the structure shown in FIG. 4F is turned upside down and attached to a tape 118A (e.g., a dicing tape 118A) supported by a frame 118B. In some embodiments, the carrier 101 is debonded so as to separate the first semiconductor die 110, the polymer layer 401 and the de-bonding layer 103 from the carrier 101. In some embodiments, the de-bonding process include projecting a light such as a laser light or an UV light on the de-bonding layer 103, so that the carrier 101 can be easily removed. In certain embodiments, the de-bonding layer 103 may be further removed or peeled off, whereas the polymer layer 401 is retained on the package structure. As shown in FIG. 4G, after the de-bonding process, the polymer layer 401 is patterned to define openings OP that reveal the seed layers 402B disposed on the bottom surface BS of the connection pads 402C. In some embodiments, after the seed layers 402B are revealed, a metal layer (Ni/Au) (not shown) may be formed on the seed layer 402B to prevent its oxidation, and also act as a barrier layer of solder. Up to here, a first package 100 in another embodiment of the disclosure is completed.

Figure 4H:
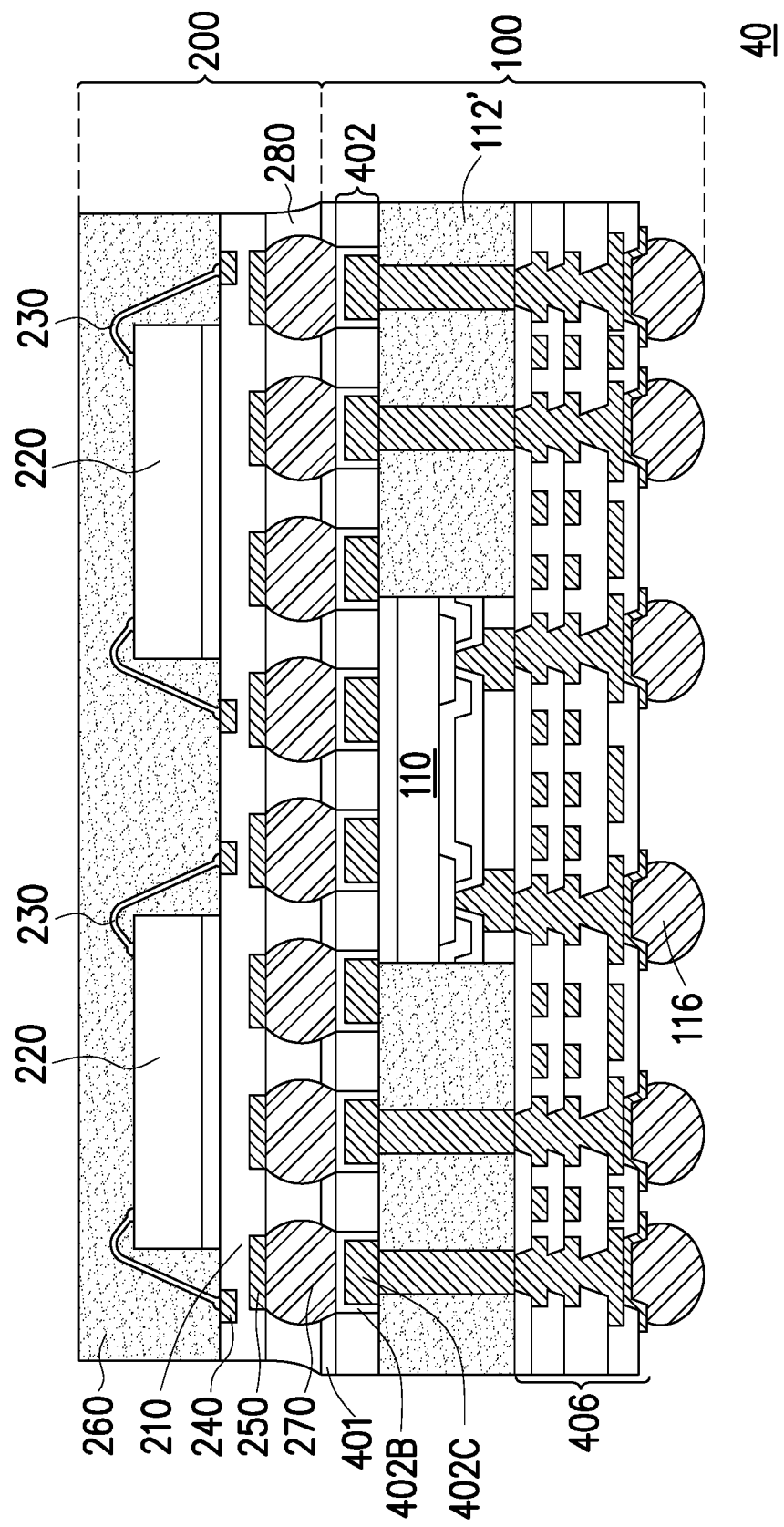

Referring to FIG. 4H, in a next step, a second package 200 is stacked or mounted on the first package 100. As illustrated in FIG. 4H, the second package 200 is electrically connected to the backside connection structure 402 of the first package 100 through a plurality of conductive balls 270. For example, the plurality of conductive balls 270 fill into the openings OP of the polymer layer 401 to be electrically connected to the seed layers 402B and the connection pads 402C. The second package 200 in FIG. 4H is the same as the second package 200 described in FIG. 1H, hence its description will not be repeated herein. After stacking the second package 200 on the first package 100 and providing electrical connection between the packages through the conductive balls 270, a package-on package structure 40 can be fabricated. In some other embodiments, the package-on-package structure 40 shown in FIG. 4H can be further modified by integrating the second semiconductor die 111 shown in FIG. 2B into the first package 100. For example, the second semiconductor die 111 having the local shielding structure 113 may be disposed adjacent to the first semiconductor die 110 shown in FIG. 4H, and being electrically connected to the redistribution layer 406.

Figure 5:
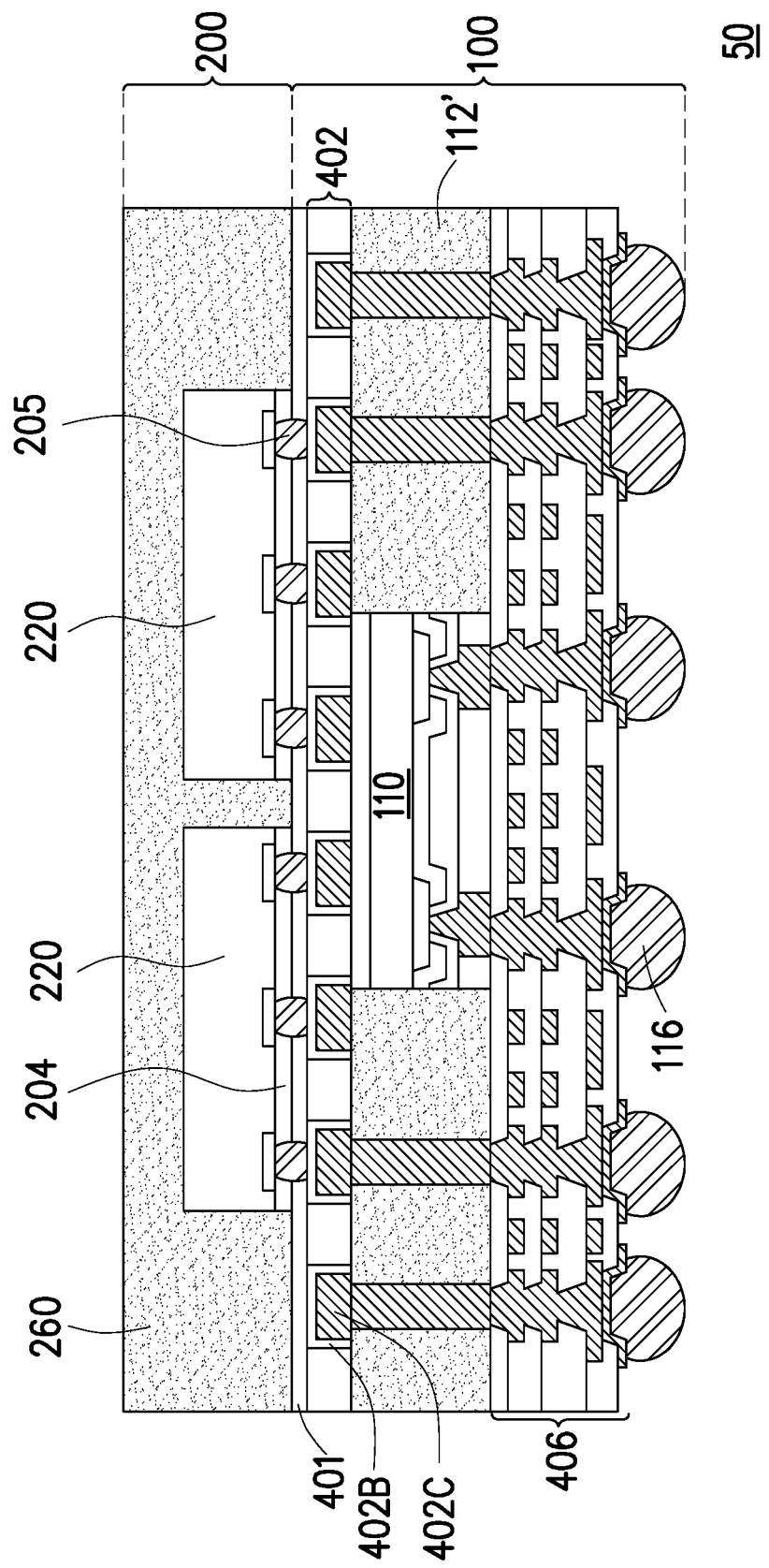
FIG. 5 is a schematic cross-sectional view of a package-on-package (PoP) structure according to some exemplary embodiments of the present disclosure.

FIG. 5 is a schematic cross-sectional view of a package-on-package (PoP) structure according to some exemplary embodiments of the present disclosure. The package-on-package structure 50 shown in FIG. 5 is similar to the package-on-package structure 40 shown in FIG. 4H. Hence, the same reference numerals will be used to refer to the same or liked parts, and their detailed description will not be repeated herein. The difference between the embodiment of FIG. 5 and the embodiment of FIG. 4H is that the semiconductor chips 220 of FIG. 4H are electrically connected to the backside connection structure 402 of the first package 100 through wire bonding, while the semiconductor chips 220 of FIG. 5 are electrically connected to the backside connection structure 402 of the first package 100 through hybrid bonding. For example, a polymer layer 204 of the semiconductor chips 220 is in contact with the polymer layer 401 of the first package 100 to form a bonding interface, while the solders 205 are boned to the connection pads 402C of the backside connection structure 402 through hybrid bonding. In some embodiments, the polymer layer 204 and the polymer layer 401 are bonding materials, such as benzocyclobutene (BCB), polybenzooxazole (PBO), polyimide, or the like. In certain embodiments, a passive component (not shown), or an integrated passive device (IPD) may be included in the second package 200, and located beside the semiconductor chips 220. In some other embodiments, the package-on-package structure 50 shown in FIG. 5 can be further modified by integrating the second semiconductor die 111 shown in FIG. 2B into the first package 100.

Figure 6:
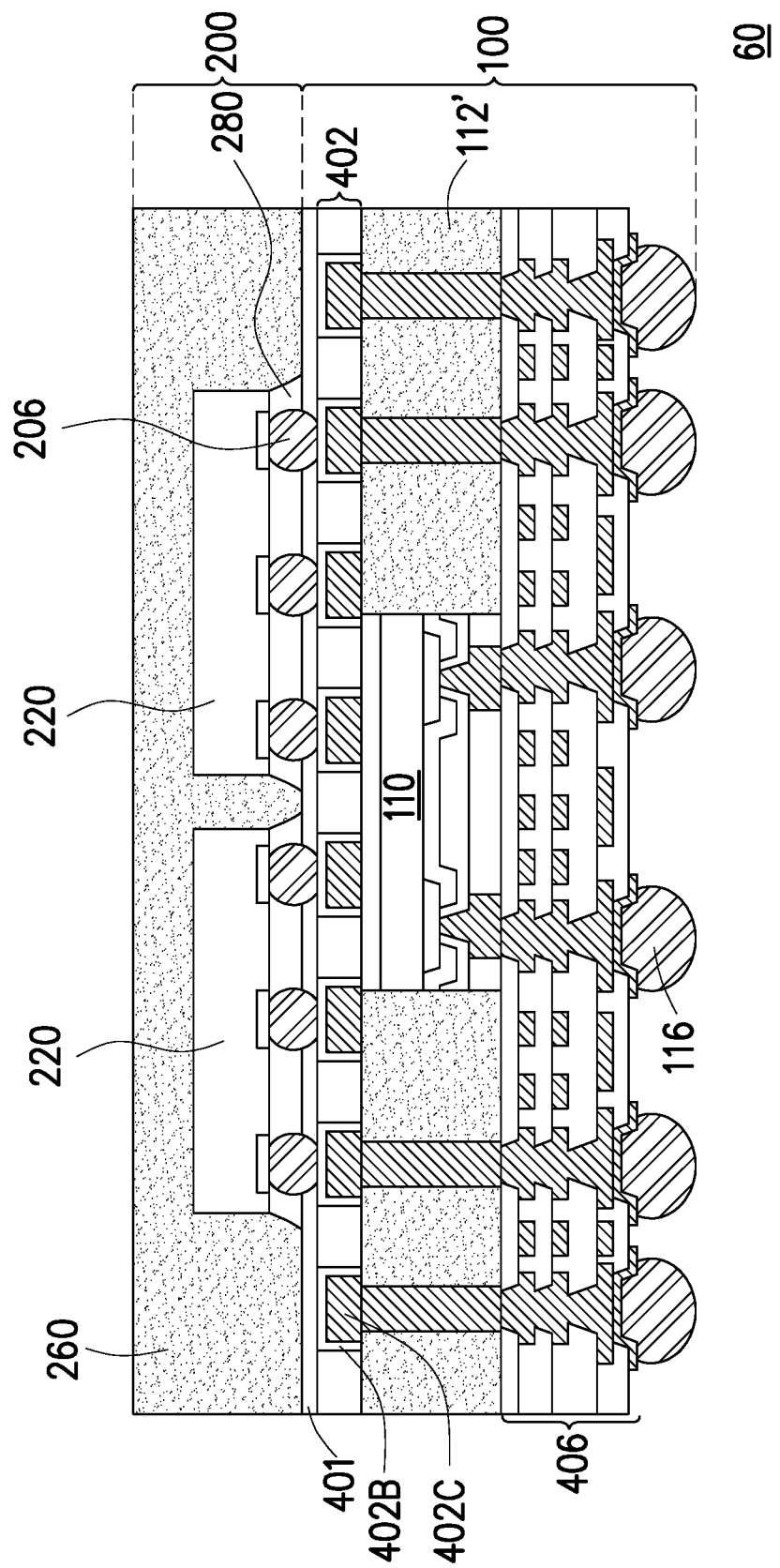
FIG. 6 is a schematic cross-sectional view of a package-on-package (PoP) structure according to some exemplary embodiments of the present disclosure.

FIG. 6 is a schematic cross-sectional view of a package-on-package (PoP) structure according to some exemplary embodiments of the present disclosure. The package-on-package structure 60 shown in FIG. 6 is similar to the package-on-package structure 40 shown in FIG. 4H. Hence, the same reference numerals will be used to refer to the same or liked parts, and their detailed description will not be repeated herein. The difference between the embodiment of FIG. 6 and the embodiment of FIG. 4H is that the semiconductor chips 220 of FIG. 4H are electrically connected to the backside connection structure 402 of the first package 100 through wire bonding, while the semiconductor chips 220 of FIG. 6 are electrically connected to the backside connection structure 402 of the first package 100 through bumps 206. The bumps 206 are, for example, controlled collapse chip connection (C4) bumps or micro-bumps. In some embodiments, the semiconductor chips 220 are bonded to the connection pads 402C of the backside connection structure 402 through the C4 bumps or micro-bumps in a face-down manner, and the underfill structure 280 fill up the spaces in between the bumps 206. In some other embodiments, the package-on-package structure 60 shown in FIG. 6 can be further modified by integrating the second semiconductor die 111 shown in FIG. 2B into the first package 100.

Figure 7:
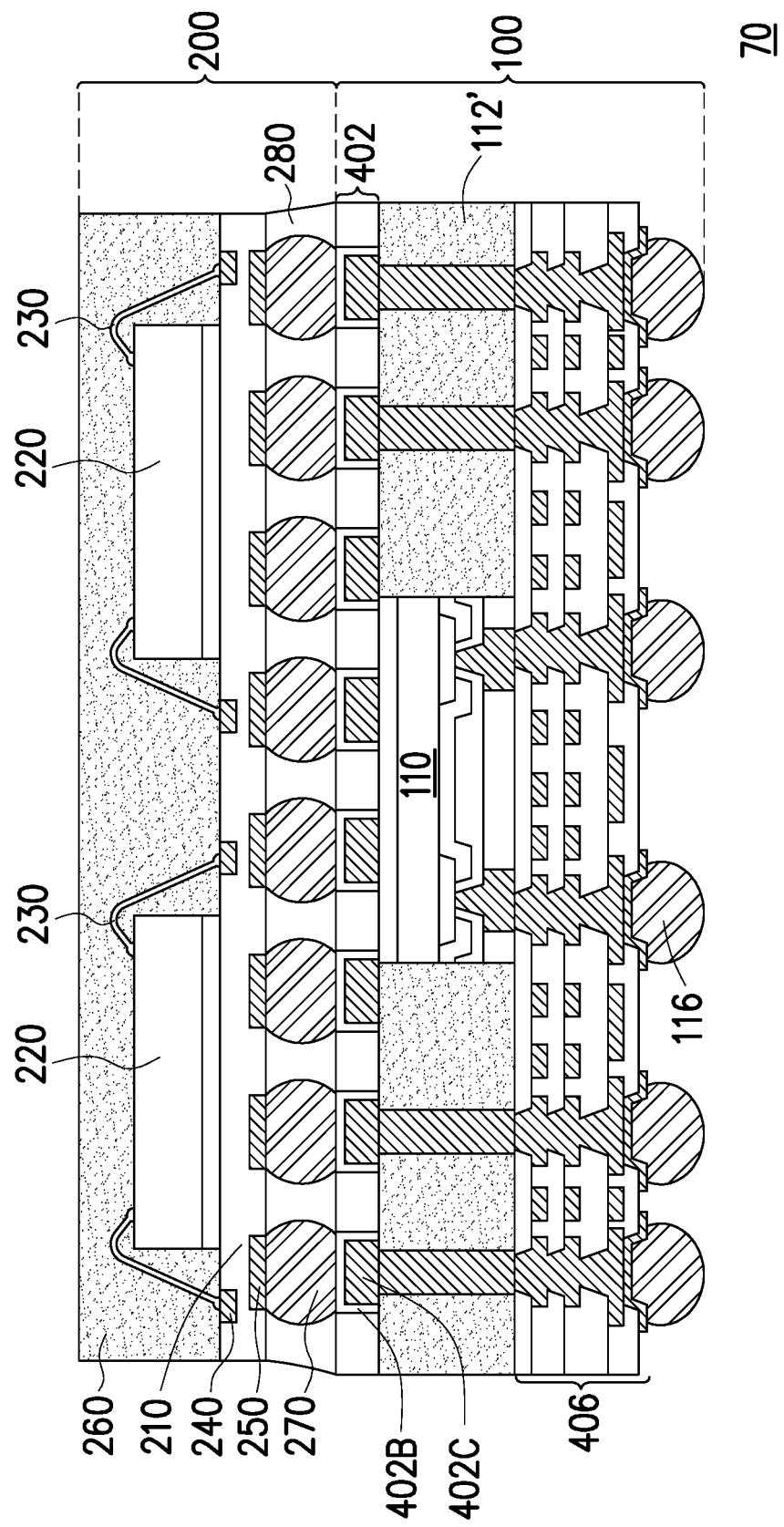
FIG. 7 is a schematic cross-sectional view of a package-on-package (PoP) structure according to some exemplary embodiments of the present disclosure.

FIG. 7 is a schematic cross-sectional view of a package-on-package (PoP) structure according to some exemplary embodiments of the present disclosure. The package-on-package structure 70 shown in FIG. 7 is similar to the package-on-package structure 40 shown in FIG. 4H. Hence, the same reference numerals will be used to refer to the same or liked parts, and their detailed description will not be repeated herein. The difference between the embodiment of FIG. 7 and the embodiment of FIG. 4H is that the polymer layer 401 is omitted. As illustrated in FIG. 7, the second package 200 is electrically connected to the backside connection structure 402 of the first package 100 through a plurality of conductive balls 270. For example, the conductive balls 270 are directly connected to the seed layers 402B and the connection pads 402C. In some other embodiments, the package-on-package structure 70 shown in FIG. 7 can be further modified by integrating the second semiconductor die 111 shown in FIG. 2B into the first package 100.

Figure 8A:
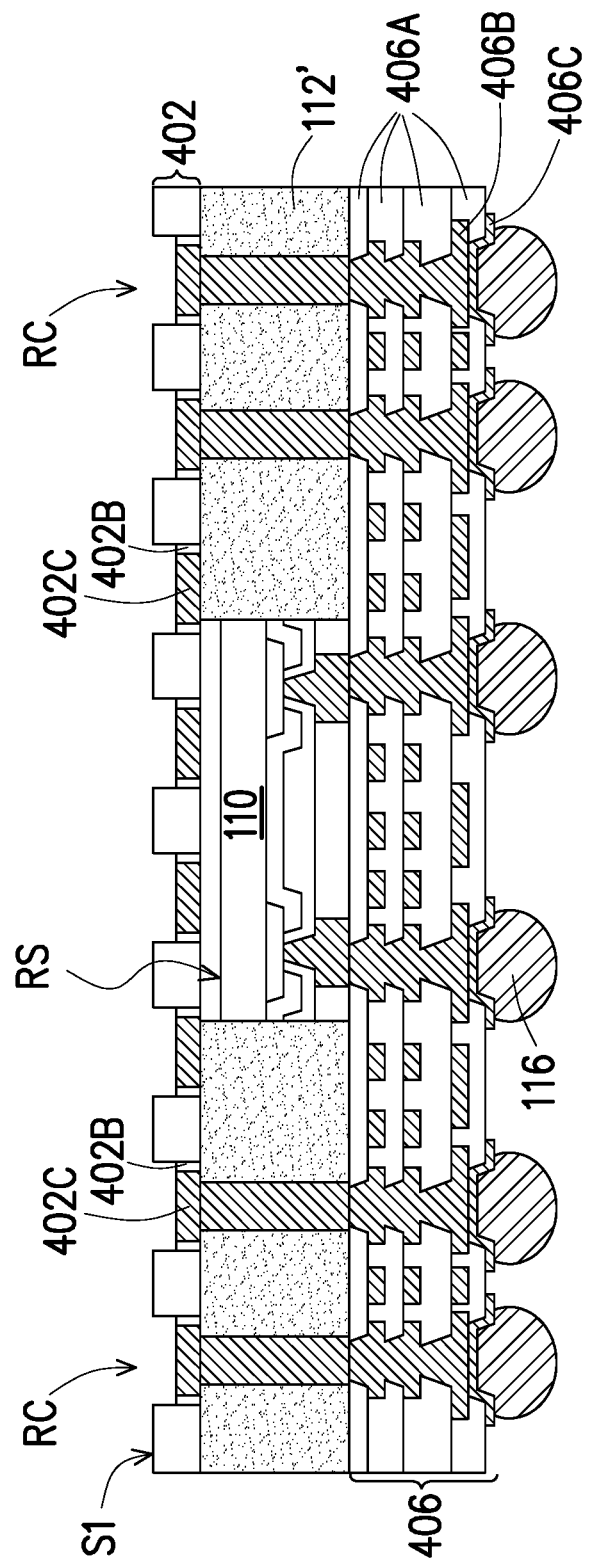
FIG. 8A to FIG. 8B are schematic cross-sectional views of various stages in a manufacturing method of a package-on-package (PoP) structure according to some exemplary embodiments of the present disclosure.
Figure 8B:
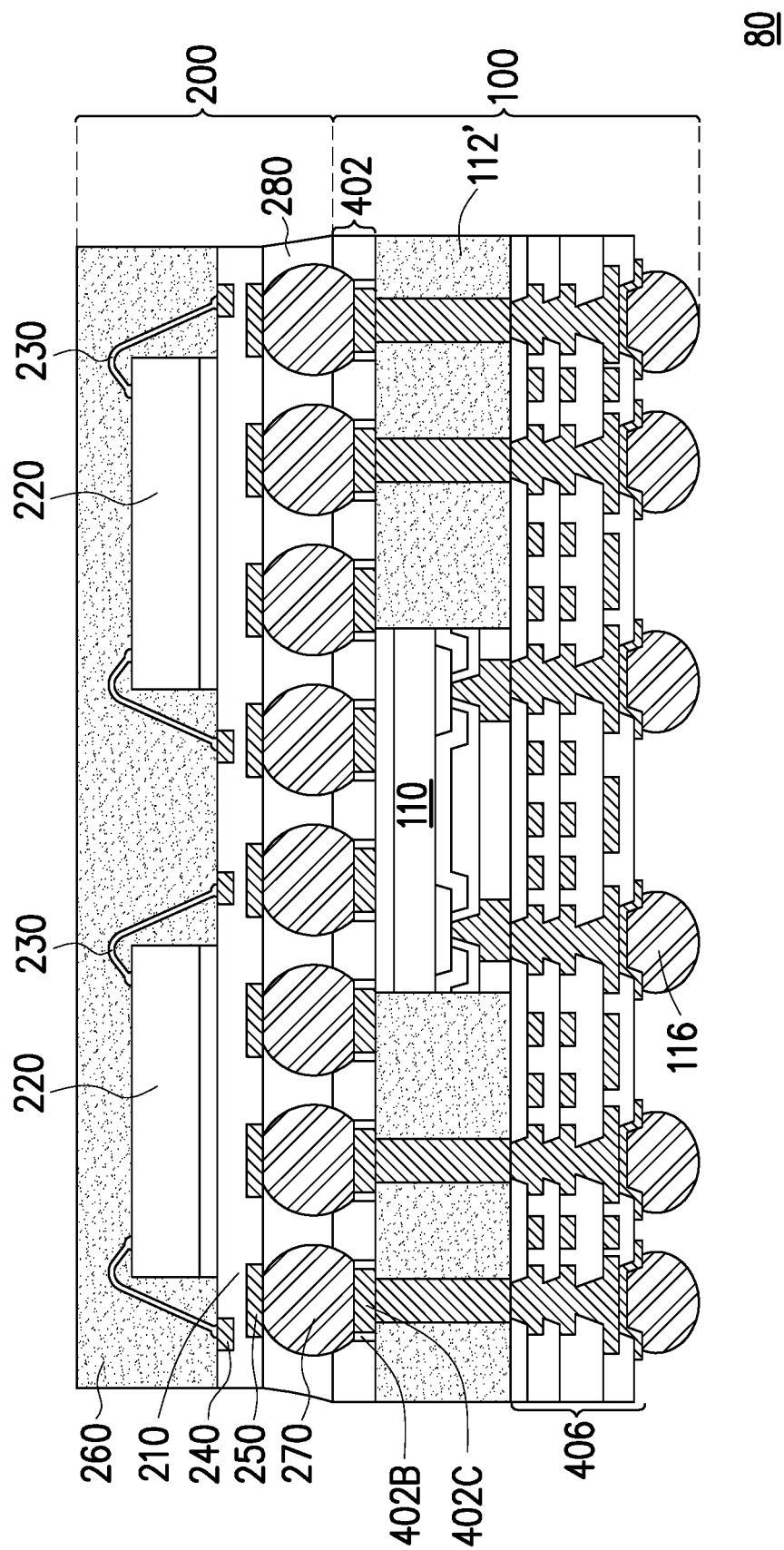

FIG. 8A to FIG. 8B are schematic cross-sectional views of various stages in a manufacturing method of a package-on-package (PoP) structure according to some exemplary embodiments of the present disclosure. The embodiment shown in FIG. 8A to FIG. 8B is similar to the embodiment shown in FIG. 7. Hence, the same reference numerals will be used to refer to the same or liked parts, and their detailed description will not be repeated herein. The difference between the embodiment of FIG. 8A to FIG. 8B and the embodiment of FIG. 7 is in the design of the backside connection structure 402.

As shown in FIG. 8A, after the de-bonding process (step of FIG. 4G, without polymer layer 401), the first surface S1 of the backside connection structure 402 and the seed layers 402B disposed on the bottom surface BS of the connection pads 402C are exposed. In some embodiments, the seed layers 402B and the connection pads 402C are further etched to define a plurality of recesses Rc in the backside connection structure 402. The plurality of recesses Re reveal the seed layer 402B and the connection pads 402C. In one embodiment, the connection pads 402C have a thickness of approximately 30 µm prior to the etching process, whereas the connection pads 402C have a thickness of approximately 15 µm after the etching process. In some embodiments, after the seed layers 402B and the connection pads 402C are etched, a metal layer (Ni/Au) (not shown) may be formed on the seed layer 402B and the connection pads 402C to prevent its oxidation, and also act as a barrier layer of solder Referring to FIG. 8B, after stacking the second package 200 on the first package 100 and providing electrical connection between the packages through the conductive balls 270, a package-on package structure 80 can be fabricated. In some other embodiments, the package-on-package structure 80 shown in FIG. 8B can be further modified by integrating the second semiconductor die 111 shown in FIG. 2B into the first package 100.

In the above embodiments, a package-on-package structure is provided with a backside connection structure. The backside connection structure may be defined by having first and second connection layers (two layer buried trace), or having connection pads. In addition, conductive pins may be used to replace conventional through insulator vias or copper cores. Accordingly, the package-on-package structure may be manufactured with a smaller package size, have lower thermal stress, and a manufacturing cost of the package structure may be reduced.

In some embodiments of the present disclosure, a package-on-package structure including a first package and a second package is provided. The first package includes a first semiconductor die, a plurality of conductive pins, an insulating encapsulant, a backside connection structure and a redistribution layer. The first semiconductor die has an active surface and a rear surface opposite to the active surface. The conductive pins are surrounding the first semiconductor die, wherein each of the plurality of conductive pins has a base portion with a first width and a body portion with a second width, the base portion is connected to the body portion and the first width being larger than the second width. The insulating encapsulant is encapsulating the first semiconductor die and the plurality of conductive pins. The backside connection structure is disposed on the rear surface of the first semiconductor die and electrically connected to the plurality of conductive pins. The redistribution layer is disposed on the active surface of the first semiconductor die, and electrically connected to the first semiconductor die and the plurality of conductive pins. The second package is stacked on the first package and electrically connected to the backside connection structure of the first package.

In some other embodiments of the present disclosure, a package-on-package structure including a first package and a second package is provided. The first package includes a first semiconductor die, a plurality of through insulator vias, an insulating encapsulant, a backside connection structure and a redistribution layer. The first semiconductor die has an active surface and a rear surface opposite to the active surface. The through insulator vias are surrounding the first semiconductor die. The insulating encapsulant is encapsulating the first semiconductor die and the plurality of through insulator vias. The backside connection structure is disposed on the rear surface of the first semiconductor die, wherein the backside connection structure includes a dielectric layer, a plurality of connection pads surrounded by the dielectric layer, and a plurality of seed layers disposed on sidewalls and a bottom surface of the connection pads, and the plurality of through insulator vias is connected to the plurality of connection pads. The redistribution layer is disposed on the active surface of the first semiconductor die, and electrically connected to the first semiconductor die and the plurality of through insulator vias. The second package is stacked on the first package and electrically connected to the plurality of connection pads of the first package through a plurality of conductive balls.

In yet another embodiment of the present disclosure, a method of manufacturing a package-on-package structure is described. The method includes the following steps. A first package is formed. The first package is formed by the following steps. A carrier is provided. A backside connection structure is boned on the carrier, wherein the backside connection structure comprises a first connection layer exposed on a first surface of the backside connection structure, and a second connection layer exposed on a second surface of the backside connection structure, the second surface is facing the carrier and is opposite to the first surface. A plurality of conductive pins is disposed on the first surface of the backside connection structure, the plurality of conductive pins is electrically connected to the first connection layer of the backside connection structure, and each of the plurality of conductive pins has a base portion with a first width and a body portion with a second width, the base portion is connected to the body portion and the first width being larger than the second width. A first semiconductor die is disposed on the first surface of the backside connection structure, wherein the first semiconductor die is surrounded by the plurality of conductive pins. An insulating encapsulant is formed on the backside connection structure encapsulating the first semiconductor die and the plurality of conductive pins. A redistribution layer is formed on the insulating encapsulant, wherein the redistribution layer is electrically connected to the plurality of conductive pins and the first semiconductor die. The carrier is de-bonded to reveal the second connection layer exposed on the second surface of the backside connection structure. A second package is stacked on the first package, wherein the second package is electrically connected to the second connection layer of the backside connection structure through a plurality of conductive balls.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package-on-package structure, comprising:
a first package, comprising:
   a first semiconductor die including conductive pillars, wherein the first semiconductor die has an active surface and a rear surface opposite to the active surface;
   a plurality of conductive pins, surrounding the first semiconductor die, wherein each of the plurality of conductive pins has a base portion with a first width and a body portion with a second width, the base portion is connected to the body portion and the first width being larger than the second width, and top surfaces of the plurality of conductive pins is coplanar with top surfaces of the conductive pillars of the first semiconductor die;
   an insulating encapsulant, encapsulating the first semiconductor die and the plurality of conductive pins, wherein a top surface of the insulating encapsulant is coplanar with the top surfaces of the plurality of conductive pins and coplanar with the top surfaces of the conductive pillars of the first semiconductor die, and the insulating encapsulant has a first region with a first thickness and a second region with a second thickness, the second thickness is greater than the first thickness, and the first semiconductor die is encapsulated by the insulating encapsulant in the first region;
   a backside connection structure disposed on the rear surface of the first semiconductor die and electrically connected to the plurality of conductive pins;
   an adhesive layer sandwiched between the first semiconductor die and the backside connection structure for joining the backside connection structure to the rear surface of the first semiconductor die;
   a redistribution layer disposed on the active surface of the first semiconductor die, and electrically connected to the first semiconductor die and the plurality of conductive pins; and
   a second semiconductor die encapsulated by the insulating encapsulant in the second region, wherein the second semiconductor die is disposed aside of the backside connection structure and electrically connected to the redistribution layer;

a second package stacked on the first package and electrically connected to the backside connection structure of the first package.

2. The package-on-package structure according to claim 1, wherein the backside connection structure comprises a first connection layer exposed on a first surface of the backside connection structure, and a second connection layer exposed on a second surface of the backside connection structure, wherein the plurality of conductive pins is connected to the backside connection structure through the first connection layer exposed on the first surface, and the second package is electrically connected to the backside connection structure of the first package through the second connection layer exposed on the second surface.

3. The package-on-package structure according to claim 2, further comprising another adhesive layer located on a rear surface of the second semiconductor die, wherein a surface of the another adhesive layer is coplanar with the second surface of the backside connection structure.

4. The package-on-package structure according to claim 1, further comprising joint structures sandwiched in between the conductive pins and the backside connection structure, wherein the joint structures are encapsulated by the insulating encapsulant.

5. The package-on-package structure according to claim 1, further comprising a local shielding structure surrounding the second semiconductor die.

6. The package-on-package structure according to claim 1, wherein sidewalls of the base portion and sidewalls of the body portion are not aligned.

7. The package-on-package structure according to claim 1, wherein the second package is disposed on and overlapped with the backside connection structure and the first semiconductor die of the first package, and non-overlapped with the second semiconductor die of the first package.

8. The package-on-package structure according to claim 1, further comprising a global shielding structure conformally covering the first package and the second package.

9. A package-on-package structure, comprising:
a first package, comprising:
a first semiconductor die, having an active surface and a rear surface opposite to the active surface;
a plurality of through insulator vias, surrounding the first semiconductor die;
an insulating encapsulant, encapsulating the first semiconductor die and the plurality of through insulator vias;
a backside connection structure disposed on the rear surface of the first semiconductor die, wherein the backside connection structure has a first surface and a second surface opposite to the first surface, and the backside connection structure comprises a dielectric layer, a plurality of connection pads surrounded by the dielectric layer, and a plurality of seed layers disposed on sidewalls and a bottom surface of the connection pads, the seed layers are revealed from the first surface of the backside connection structure, and the plurality of through insulator vias is connected to the plurality of connection pads;
a polymer layer disposed on the first surface of the backside connection structure, wherein the polymer layer has openings that reveal the seed layers disposed on the bottom surface of the connection pads; and a redistribution layer disposed on the active surface of the first semiconductor die, and electrically connected to the first semiconductor die and the plurality of through insulator vias;

a second package stacked on the first package and electrically connected to the plurality of connection pads of the first package through a plurality of conductive balls, wherein the plurality of conductive balls fill into the openings of the polymer layer to be electrically connected to the seed layers and the plurality of connection pads.

10. The package-on-package structure according to claim 9, wherein a top surface of the connection pads is revealed from the second surface of the backside connection structure, and the plurality of through insulator vias is electrically connected to the top surface of the connection pads.

11. The package-on-package structure according to claim 10, wherein a revealed surface of the seed layers disposed on the bottom surface of the connection pads are substantially coplanar with the first surface of the backside connection structure, and the top surface of the connection pads are substantially coplanar with the second surface of the backside connection structure.

12. The package-on-package structure according to claim 9, wherein the plurality of connection pads has a thickness of 30 µm or less.

13. The package-on-package structure according to claim 9, further comprising an adhesive layer joining the first surface of the backside connection structure to the rear surface of the first semiconductor die.

14. A method of manufacturing a package-on-package structure, comprising:
forming a first package, comprising:
providing a carrier;
bonding a backside connection structure on the carrier, wherein the backside connection structure comprises a first connection layer exposed on a first surface of the backside connection structure, and a second connection layer exposed on a second surface of the backside connection structure, the second surface is facing the carrier and is opposite to the first surface;
disposing a plurality of conductive pins on the first surface of the backside connection structure, the plurality of conductive pins is electrically connected to the first connection layer of the backside connection structure, and each of the plurality of conductive pins has a base portion with a first width and a body portion with a second width, the base portion is connected to the body portion and the first width being larger than the second width;
disposing a first semiconductor die including conductive pillars on the first surface of the backside connection structure through an adhesive layer, wherein the first semiconductor die is surrounded by the plurality of conductive pins, and the adhesive layer is sandwiched between the first semiconductor die and the first surface of the backside connection structure;
forming an insulating encapsulant on the backside connection structure encapsulating the first semiconductor die and the plurality of conductive pins, wherein a top surface of the insulating encapsulant is coplanar with top surfaces of the plurality of conductive pins and coplanar with top surface of the conductive pillars of the first semiconductor die;
forming a redistribution layer on the insulating encapsulant, wherein the redistribution layer is electrically connected to the plurality of conductive pins and the first semiconductor die; and de-bonding the carrier to reveal the second connection layer exposed on the second surface of the backside connection structure;

stacking a second package on the first package, wherein the second package is electrically connected to the second connection layer of the backside connection structure through a plurality of conductive balls.

15. The method according to claim 14, further comprises providing joint structures connected to the first connection layer, then electrically connecting the plurality of conductive pins to the backside connection structure through the joint structures.

16. The method according to claim 15, wherein the insulating encapsulant further encapsulates the joint structures.

17. The method according to claim 14, further comprises disposing a second semiconductor die on the first surface of the backside connection structure adjacent to the first semiconductor die, then forming the insulating encapsulant to further encapsulates the second semiconductor die.

18. The method according to claim 14, further comprises disposing a second semiconductor die on the carrier aside of the backside connection structure, then forming the insulating encapsulant to further encapsulates the second semiconductor die.

19. The method according to claim 15, wherein the insulating encapsulant is formed with a first region having a first thickness and a second region having a second thickness, the second thickness is greater than the first thickness, the first semiconductor die is encapsulated by the insulating encapsulant in the first region, and the second semiconductor die is encapsulated by the insulating encapsulant in the second region.

20. The method according to claim 14, further comprising forming an underfill structure to encapsulate the plurality of conductive balls.

* * * * *